United States Patent
Alberts

(10) Patent No.: US 7,744,705 B2
(45) Date of Patent: Jun. 29, 2010

(54) GROUP I-III-VI QUATERNARY OR HIGHER ALLOY SEMICONDUCTOR FILMS

(75) Inventor: Vivian Alberts, Johannesburg (ZA)

(73) Assignee: University of Johannesburg, Johannesburg (ZA)

( * ) Notice: Subject to any disclaimer, the term of this patent is extended or adjusted under 35 U.S.C. 154(b) by 575 days.

(21) Appl. No.: 10/568,229

(22) PCT Filed: Aug. 13, 2004

(86) PCT No.: PCT/IB2004/051459

§ 371 (c)(1), (2), (4) Date: Feb. 14, 2006

(87) PCT Pub. No.: WO2005/017979

PCT Pub. Date: Feb. 24, 2005

(65) Prior Publication Data

US 2006/0222558 A1 Oct. 5, 2006

(30) Foreign Application Priority Data

Aug. 14, 2003 (ZA) ................... 2003/6316
Mar. 30, 2004 (ZA) ................... 2004/2497

(51) Int. Cl.
C22C 9/00 (2006.01)
H01L 31/00 (2006.01)

(52) U.S. Cl. .......... 148/432; 148/433; 148/434; 148/435; 148/436; 420/489; 136/262; 136/263; 438/478

(58) Field of Classification Search ............... 420/489; 148/432–436; 136/262–263; 438/478
See application file for complete search history.

(56) References Cited

U.S. PATENT DOCUMENTS

| 5,356,839 A | 10/1994 | Tuttle et al. |
| 5,436,204 A | 7/1995 | Albin et al. |
| 5,441,897 A | 8/1995 | Noufi et al. |

FOREIGN PATENT DOCUMENTS

| EP | 0724775 | 8/1995 |
| EP | 0694209 | 1/1996 |
| WO | WO9424696 | 10/1994 |
| WO | WO9606454 | 2/1996 |

(Continued)

OTHER PUBLICATIONS

International Search Report, International Application No. PCT/IB2004/051458, mailed Jul. 12, 2005.

(Continued)

Primary Examiner—Sikyin Ip
(74) Attorney, Agent, or Firm—Knobbe Martens Olson & Bear LLP

(57) ABSTRACT

This invention relates to group IB-IIIA. VIA quaternary or higher alloys. More particularly, this invention relations to group IB-IIIA-VIA quaternary or pentenary alloys which are suitable for use as semiconductor films. More specifically, the invention relates to quaternary or pentenary alloys which are substantially homogeneous and are characterized by an x-ray diffraction pattern (XRD) having a main [112] peak at a 2θ angle ($2\theta_{(112)}$) of from 26° to 28° for Cu radiation at 40 kV, wherein a glancing incidence x-ray diffraction pattern (GIXRD) for a glancing angle of from 0.2° to 10° reflects an absolute shift in the $2\theta_{(112)}$ angle of less than 0.06°.

39 Claims, 28 Drawing Sheets

FOREIGN PATENT DOCUMENTS

WO      WO9625768      8/1996

OTHER PUBLICATIONS

International Search Report, International Application No. PCT/IB2004/051459, mailed Jul. 27, 2005.

International Preliminary Report on Patentability, International Application No. PCT/IB2004/051459, mailed Dec. 22, 2005.

Kushiya et al. "Development of Cu(InGa)Se$_2$ Thin-Film Solar Cells with Zn-Compound Buffer" 13$^{th}$ European Photovoltaic Solar Energy Conference, Nice, France, Oct. 1995, vol. 2 of 2, Conf. 13, pp. 2016-2019.

Kushiya et al. "Formation Chemistry of Polycrystalline Cu(InGa)Se$_2$ Thin-Film Absorbers Prepared by Selenization of Cu-Ga/In Stacked Precursor Layers with H$_2$Se Gas" Mat. Res. Soc. Symp. Proc., 1996, 426: 177-182.

Kushiya et al. "The Role of Cu(InGa)(SeS)$_2$ Surface Layer on a Graded Band-Gap Cu(InGa)Se$_2$ Thin-Film Solar Cell Prepared by Two-Stage Method" 25$^{th}$ Photovoltaic Specialists Conference, pp. 989-992 (May 1996).

Nagoya et al. "Role of incorporated sulfur into the surface of Cu(InGa)Se2 thin-film absorber" Solar Energy Materials and Solar Cells, vol. 67, No. 1-4, Mar. 2001, pp. 247-253.

Ohashi et al. "Improved CIGS thin-film solar cells by surface sulfurization using In2S3 and sulfur vapor" Solar Energy Materials and Solar Cells, Elsevier Science Publishers, Amsterdam, NL, vol. 67, No. I-4, Mar. 2001, pp. 261-265.

Turcu et al. "Composition dependence of defect energies and band alignments in the Cu(In$_{1-x}$Ga$_x$)(Se$_{1-y}$S$_y$)$_2$ alloy system" Journal of Applied Physics, Feb. 1, 2002, 91(3): 1391-1399.

File wrapper for U.S. Appl. No. 10/568,227, filed May 17, 2006, titled "Method for the Preparation of Group IB-IIA-VIA Quaternary or Higher Alloy Semiconductor Films", listing as inventor Vivian Alberts.

V. Alberts, J. H. Schön, and E. Bucher, *Journal of Appl. Phys.*, 84(12), 1998, 6881-6885, "Improved material properties of polycrystalline CuInSe$_2$ prepared by rapid thermal treatment of metallic allows in H$_2$Se/Ar."

J. Palm, V. Probst, W. Stetter et al., *Thin Solid Films*, 451-452 (2004) 544-551, "CISSSe thin film PV modules: from fundamental investigations to advanced performance and stability."

M. Marudachalam, H. Hichri, R. Klenk, R.W. Birkmire, W.N. Schfarman and J. M. Schultz, *Appl. Phys. Lett.* 67(26), 1995, 3978, "Preparation of homogeneous Cu(InGa)Se$_2$ films by selenization of metal precursors in H$_2$Se atmosphere."

K. Kushiya, M. Tachiyuki, T. Kase, I. Sugiyama, Y. Nagoya, D. Okumura, M. Satoh, O. Yamase and H. Takeshita Sol. Energy Mater. Sol. Cells 49, 1997, 277, "Fabrication of graded band-gap Cu(InGa)Se$_2$ thin-film mini-modules with a Zn(O,S,OH)$_x$ buffer layer."

I. M. Kötschau, H. Kerber, H. Wiesner, G. Hanna and H. W. Schock, Proceedings of the 16$^{th}$ European Photovoltaic Solar Energy Conference, May 1-5, 2000, Glasgow, UK, pp. 724-727, "Band Gap Grading in Cu(In,Ga)(S,SE)$_2$_based solar cells."

R. Gay, M. Dietrich, C. Fredric, C. Jensen, K. Knappm, D. Tarrant and D. Willett, "Efficiency and process improvements in CuInSe$_2$-based modules" Proceedings of the international conference on E. C. Photovoltaic Solar Energy, vol. 12 (1), 1994, 935-938.

T. Nakada, H. Ohbo, T. Watanabe, H. Nakazawa, M. Matsui and A. Kunioka, Solar Energy Materials and Solar Cells 49, 1997, 285, "Improved Cu(In,Ga)(S,Se)$_2$ thin film solar cells by solar sulfurization."

A. Gupta and S. Isomura, *Sol. Energy Mater. Sol Cells* 53, 1998, 385, "Precursor modification for preparation of CIS films by selenization technique."

Office Action dated Apr. 22, 2009 for U.S. Appl. No. 10/568,227, filed May 17, 2006.

"Experimental study of graded bandgap Cu(InGa)(SeS)$_2$ thin films grown on glass/molybdenum substrates by selenization and sulphidation" by Delsol et al. Solar Energy Materials a& Solar Cells 82 (2004) 587-599.

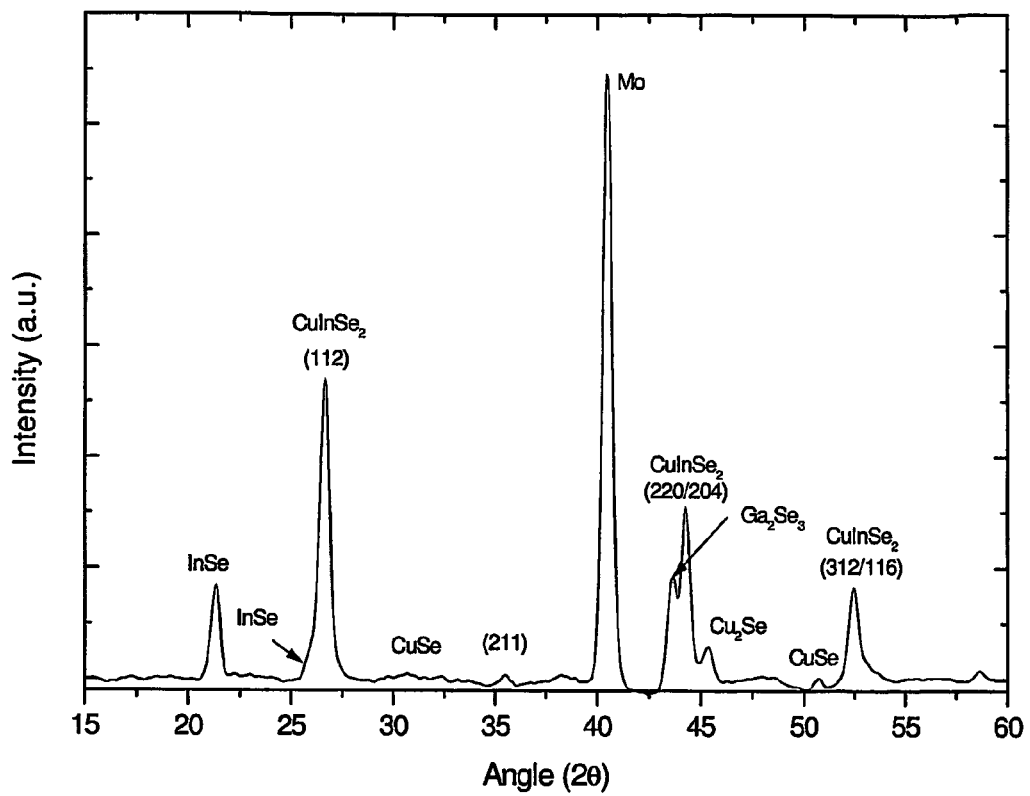
FIGURE 2.1

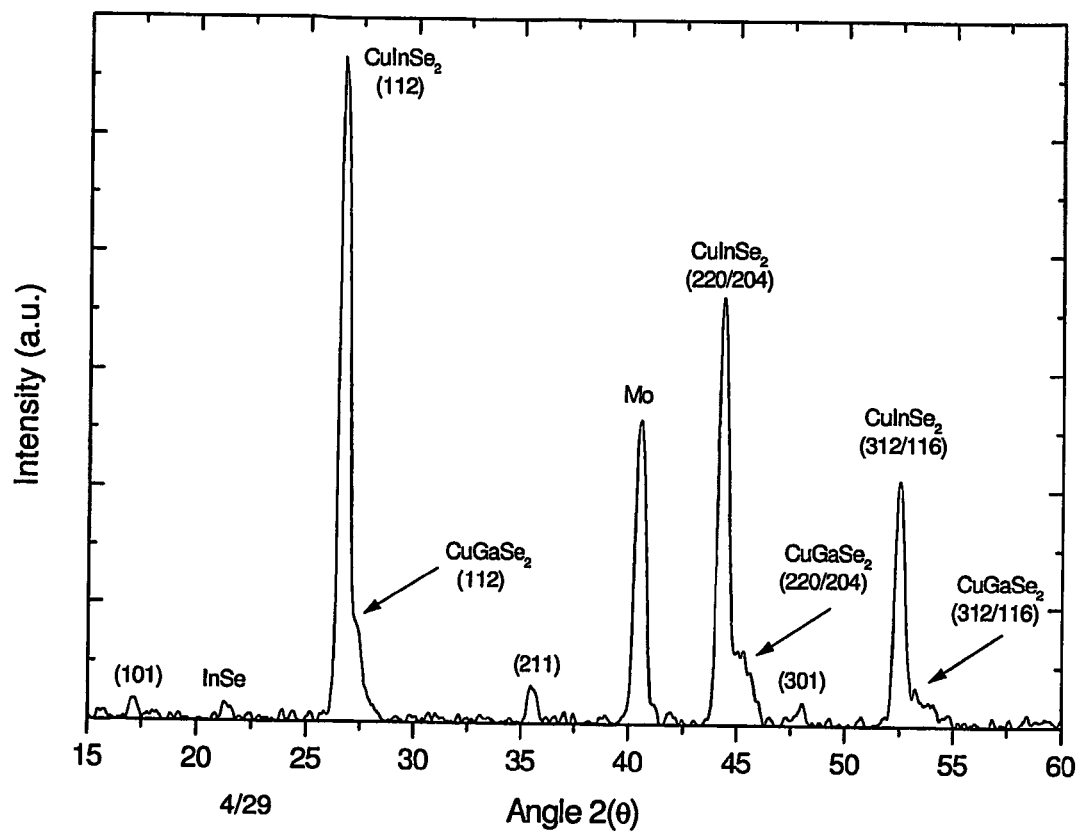
FIGURE 2.2

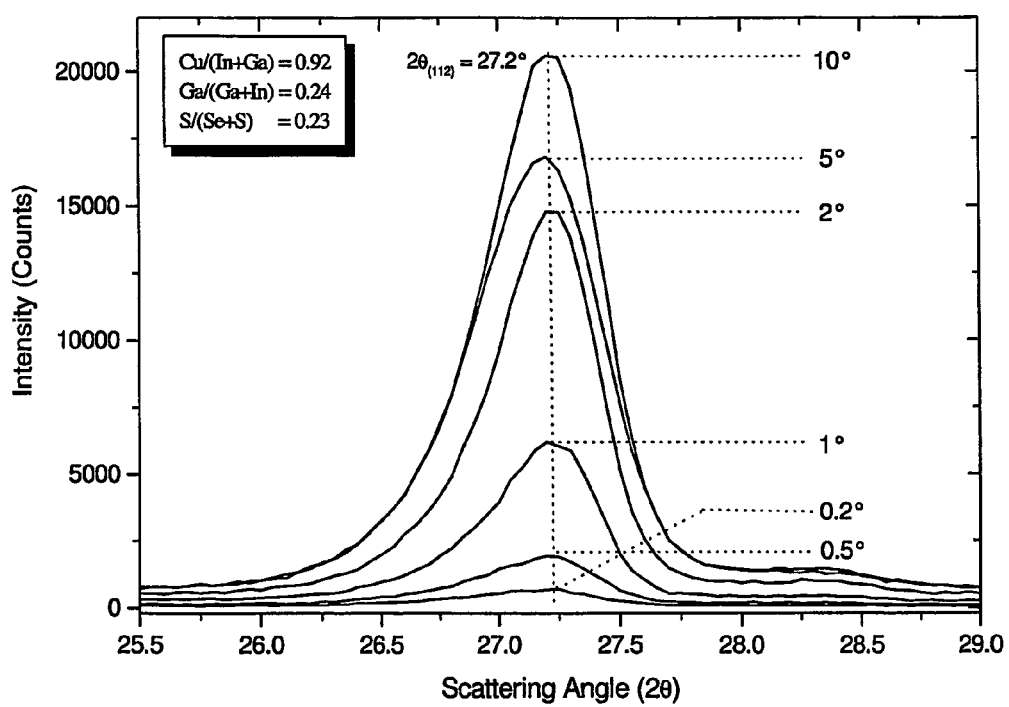
FIGURE 4.1

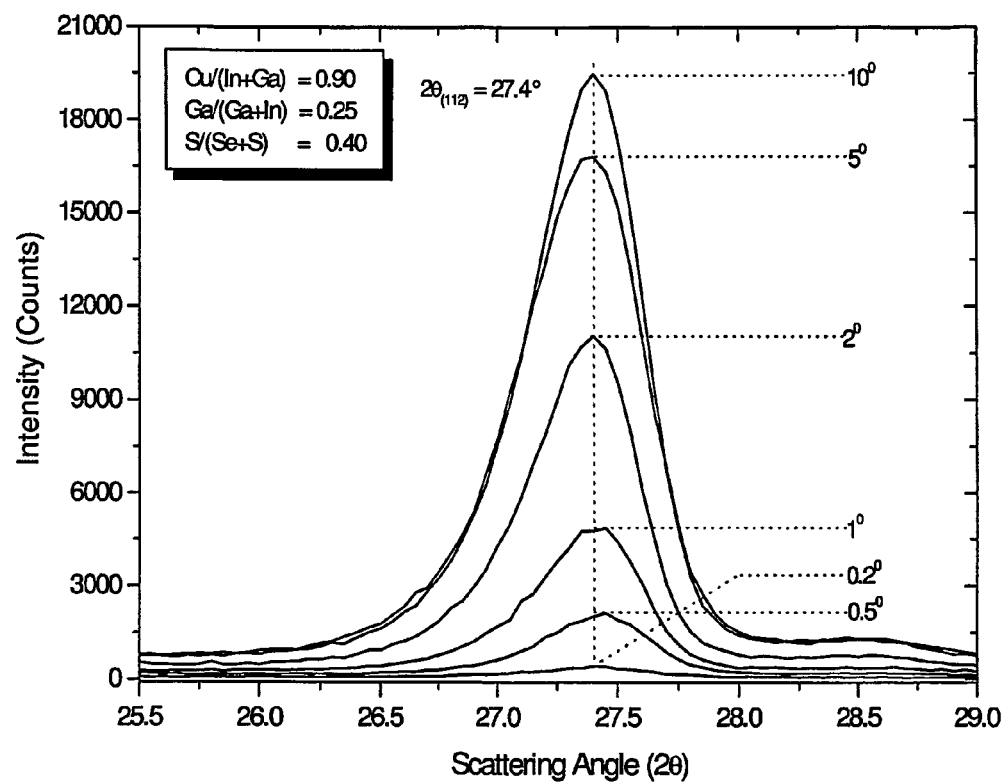
FIGURE 4.2

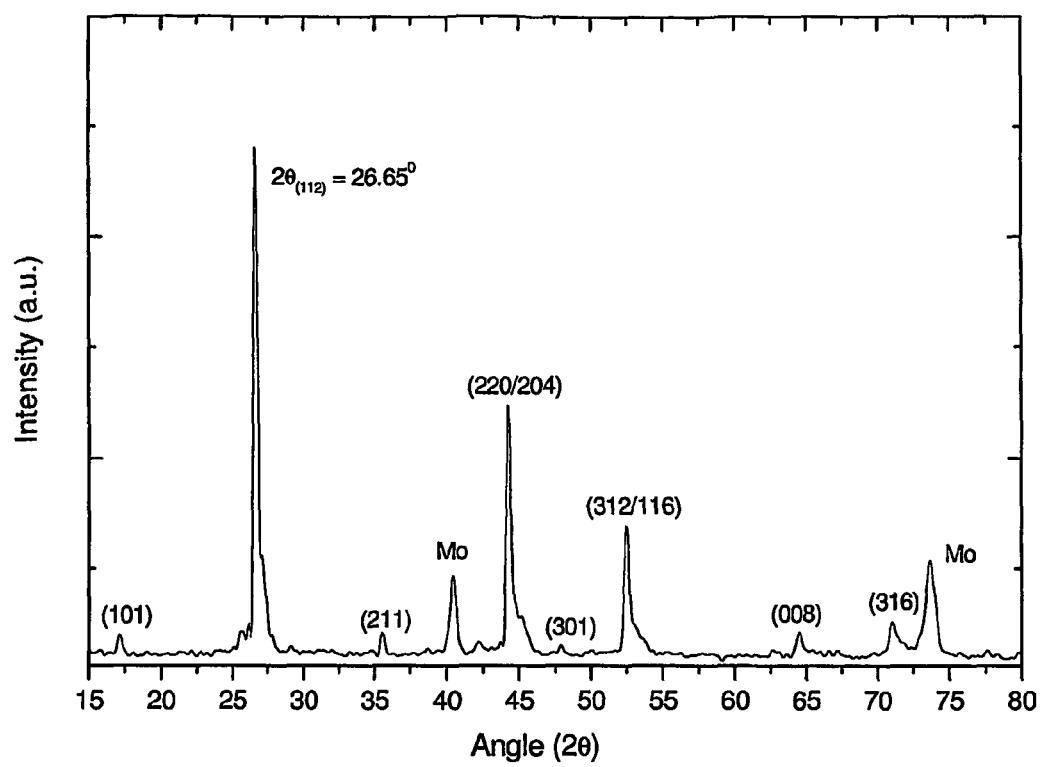
FIGURE 15.1

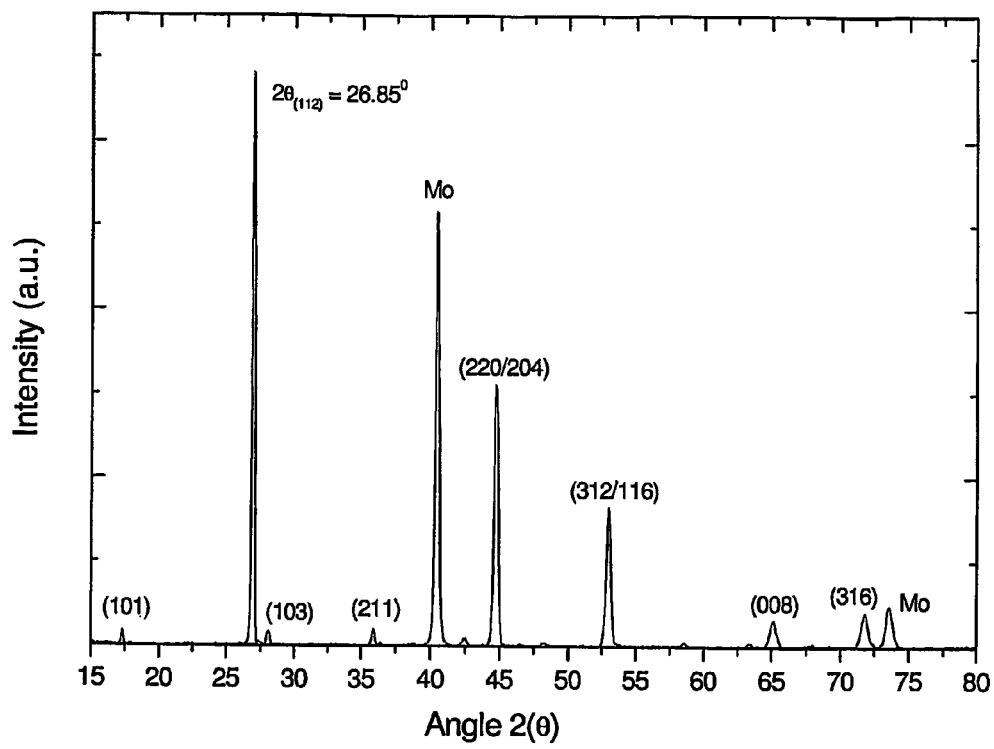
FIGURE 15.2

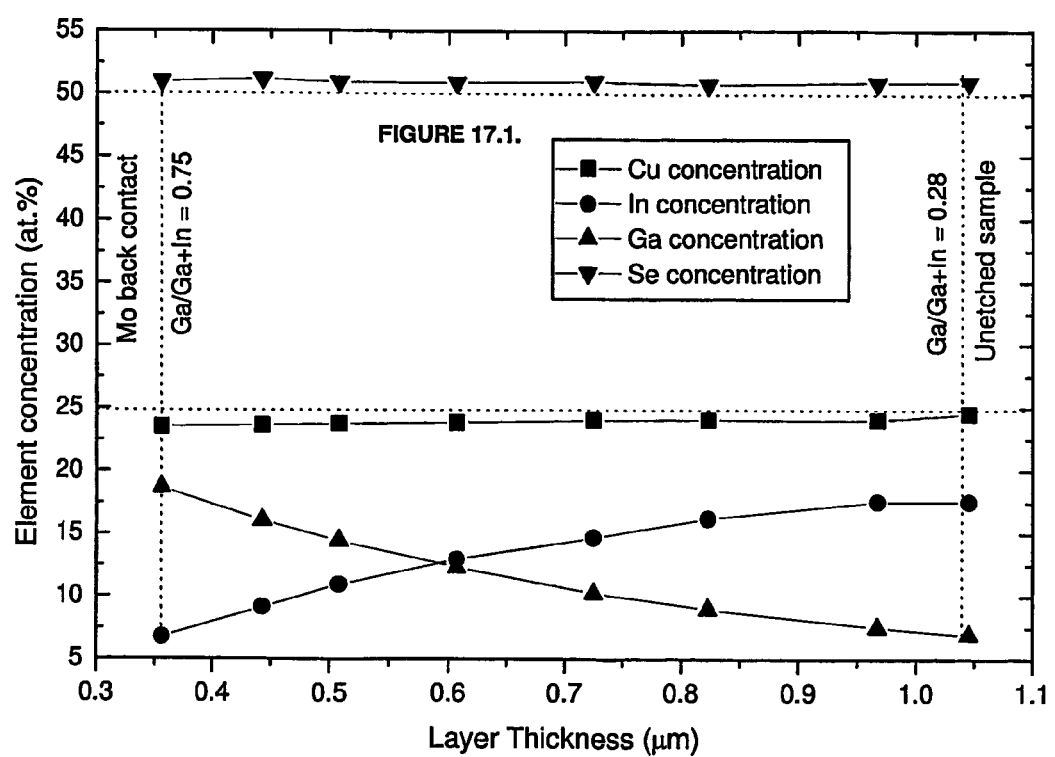
FIGURE 17.1

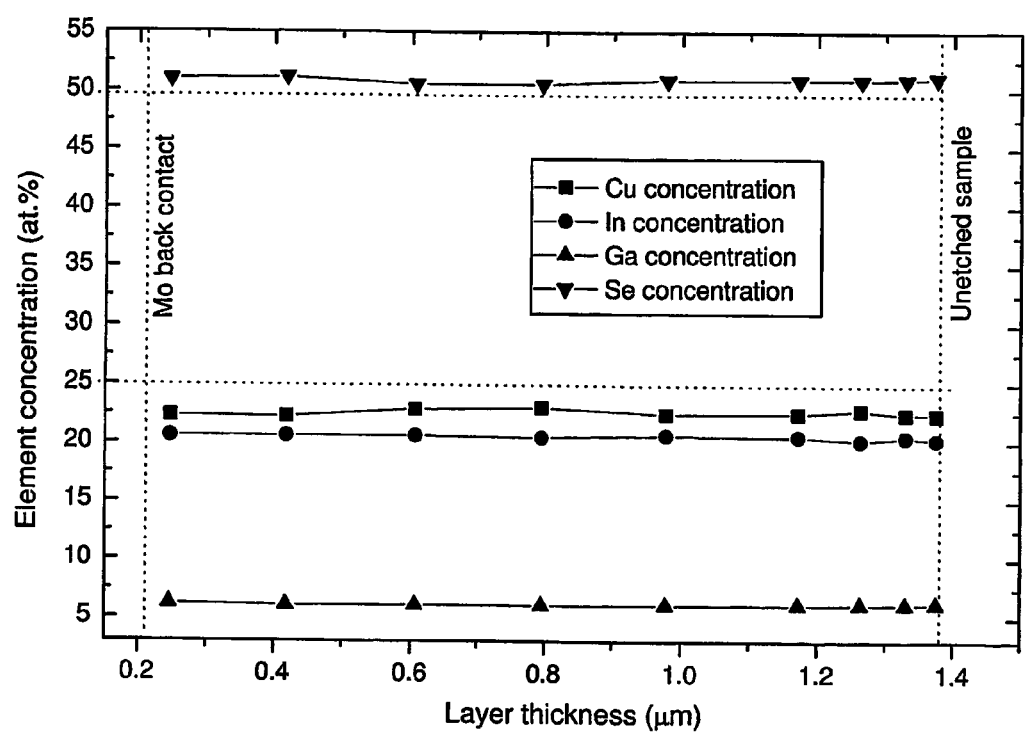
FIGURE 17.2

US 7,744,705 B2

GROUP I-III-VI QUATERNARY OR HIGHER ALLOY SEMICONDUCTOR FILMS

REFERENCE TO RELATED APPLICATIONS

This application is the national phase filing under 35 U.S.C. §371 of PCT Application No. PCT/IB2004/051459, filed Aug. 13, 2004, and claims priority to South African Application No. 2003/6316, filed Aug. 14, 2003 and South African Application No. 2004/2497, filed Mar. 30, 2004.

FIELD OF THE INVENTION

This invention relates to group I-III-VI quaternary or higher alloy semiconductor films More particularly, but not exclusively, this invention relates to group I-III-VI quaternary or higher alloys which are substantially homogeneous.

The invention further relates to substantially homogeneous group I-III-VI quaternary or higher alloy semiconductor films which are suitable for use as semiconductor films in photovoltaic/solar cells.

BACKGROUND TO THE INVENTION

Definitions

For the purposes of this specification the term "pentenary alloy" refers to an alloy having 5 different elements. So for example, Cu(In,Ga)(S,Se)$_2$ is a group IB-IIIA-VIA pentenary alloy wherein the 5 different elements are copper (Cu), indium (In), gallium (Ga), selenium (Se) and sulfur (S). Similarly the term "quaternary alloy" refers to an alloy having 4 different elements. So for example, Cu(In,Ga)Se$_2$ is a group IB-IIIA-VIA quaternary alloy. Likewise, a ternary alloy has three different elements and a binary alloy has two different elements.

The term "homogeneous" alloy means that the different elements constituting the alloy are distributed homogeneously through the alloy such that the alloy has a substantially constant lattice parameter, interplanar spacing (referred to as d-spacing hereinafter) and band gap value throughout. In other words, the absolute shift of the main diffraction peak of the alloy [$2\theta_{(112)}$], characterised by glancing incident x-ray diffraction for glancing angles between 0.5° to 10°, is negligible.

Furthermore, for the purposes of this specification, a "heterogeneous" alloy means that the alloy includes a graded band gap structure and suffers from compositional grading such that one or more of the constituent elements of the alloy vary in atomic concentration through the alloy. The heterogeneous alloy may further include lattice mismatches in respect of the crystal structure and accordingly may suffer from a variation in the lattice parameters of the crystal structure through the alloy.

For the purposes of convenience, elements are referred to by their commonly accepted chemical symbols, including copper (Cu), indium (In), gallium (Ga), selenium (Se), sulphur (S), argon (Ar), molybdenum (Mo) and aluminium (Al). Also, the use of a hyphen (e.g. in Cu—In—Ga or Cu—In) does not necessarily indicate a compound, but indicates a coexisting mixture of the elements joined by the hyphen.

For the purposes of clarity, reference to group IB refers to the group in the periodic table comprising the elements of Cu, Ag and Au. Reference to group IIIA refers to the group in the periodic table comprising the elements B, Al, Ga, In and Ti. Furthermore, reference to group VIA refers to the group in the periodic table comprising the elements O, S, Se, Te and Po.

The use of a comma between two elements, for example (Se,S), (In,Ga) is merely used for the sake of convenience and so for example, (Se,S), is short hand for (Se$_{1-y}$S$_y$).

Semiconductor Film Material

Crystalline and multi-crystalline silicon is to date the primary material used in the production of solar modules/photovoltaic cells. The main problem associated with this material is the high cost of manufacturing. In an effort to reduce fabrication costs and increase material utilization, semiconductor thin film alloys have been the subject of intensive research. In this regard, group IB-IIIA-VIA alloys, such as CuInSe$_2$, CuGaSe$_2$ and CuInS$_2$, are promising candidates for absorber layers in thin film photovoltaic cells or devices.

Of particular interest are semiconductor films comprising group IB-IIIA-VIA alloys wherein the alloy includes Ga in combination with another group III element, since the presence of Ga in such films results in semiconductor films with higher band gap values and subsequently, in solar/photovoltaic cell devices, with higher open-circuit voltages and reduced short circuit currents. Of even greater interest are semiconductor films comprising pentenary alloys (pentenary alloy semiconductor films).

In respect of semiconductor films comprising pentenary alloys having Cu(In$_{1-x}$Ga$_x$)(Se$_{1-y}$S$_y$)2 as a general formula, the band gap can be shifted systematically between 1.0 and 2.4 eV in order to achieve an optimum match with the solar spectrum. Optimization of this material system has already resulted in laboratory-scale solar cell devices with conversion efficiencies exceeding 18%.

Prior Art Processes

There are a number of methods for producing group IB-IIIA-VIA semiconductor films, the two most common methods being the traditional two step process and the co-evaporation process.

The Traditional Two Step Process

The above process typically involves (i) the deposition of metallic precursors such as Cu, In and Ga, on a substrate which is more often than not coated with molybdenum, by DC magnetron sputtering and then (ii) the reactive annealing of the precursors in an atmosphere containing Se and/or S vapours or H$_2$Se/Ar and/or H$_2$Se/Ar gases. These techniques are disclosed in an article by V. Alberts, J. H. Schön, and E. Bucher, Journal of Appl. Phys. 84(12), 1998, 6881 and by A. Gupta and S. Isomura, Sol. Energy Mater. Sol. Cells 53, 1998, 385.

Without wishing to be bound by theory and referring to an article by J. Palm, V. Probst, W Stetter and others, Thin Solid Films 451-452 (2004) 544-551, the selenisation of Cu—In—Ga metallic precursors is thought to produce binary alloys such as CuSe and In$_4$Se$_3$, Cu$_{2-x}$Se and InSe. The subsequent reaction between these binary precursor phases at temperatures above 370° C. leads to the formation of the ternary alloy of CuInSe$_2$ (CIS). It is believed that during selenisation, only the latter alloy is formed and the selenisation of Ga is kinetically impeded such that Ga is driven towards the molybdenum substrate during the formation of CIS. It is further believed that on further annealing, a separate layer of Cu(In,Ga)Se$_2$ (CIGS) is formed such that a double layer structure results comprising a well crystallised CIS layer on top of a Ga-rich fine grained CIGS layer in contact with the back electrode. Extended annealing, which is commercially not preferable, results in Ga diffusion from the back electrode to the surface of the structure.

The effect of a segregated or graded film structure with most of the gallium residing at the back of the film, is that the absorber film exhibits a low band gap value in the active region of the photovoltaic cell, which ultimately limits the $V_{oc}$ of the device. (The open-circuit voltages ($V_{oc}$) and short circuit currents ($J_{sc}$) of solar modules/photovoltaic cells are directly related to the band gap of the semiconductor material. In the case of CuInSe$_2$ with a low band gap value of 1 eV, the $V_{oc}$ values are typically limited to 500 mV, while values close to 1000 mV can be achieved using a CuGaSe$_2$ absorber layer with a higher band gap value of 1.65 eV.)

In addition, in the case of extreme grading, lattice mismatches within the graded absorber films introduce electrically active structural defects, which negatively impact on the device performance.

In order to overcome the disadvantage of a low band gap heterogeneous Cu(In,Ga)Se$_2$ alloy, formed by the traditional two step process, films are commonly reacted with H$_2$S.

Present industrial processes include a post-sulfurization step in which a certain fraction of the selenium species in the top surface region of the film are replaced with sulfur. (K. Kushiya, M. Tachiyuki, T. Kase, I. Sugiyama, Y. Nagoya, D. Okumura, M. Satoh, O. Yamase, and H. Takeshita, Sol. Energy Mater. Sol. Cells 49, 1997, 277; R. Gay, M. Dietrich, C. Fredric, C. Jensen, K. Knapp, D. Tarrant and D. Willett, Proceedings of the International Conference on E. C. Photovoltaic Solar Energy, Vol. 12(1), 1994, 935; and T. Nakada, H. Ohbo, T. Watanabe, H. Nakazawa, M. Matsui and A. Kuniioka, Solar Energy Materials and Solar Cells 49, 1997, 285).

This approach ultimately results in the formation of a thin Cu(In,Ga)(Se,S)$_2$ surface layer on the resultant graded Cu(In$_{1-x}$Ga$_x$)Se$_2$ structure. The surface layer has an abrupt grading and the depth into the Cu(In,Ga)(Se$_2$ structure is in the order of 50 nm.

The disadvantages of the above post-sulfurisation step, which is already applied on an industrial scale, are:
(i) the slow rate of exchange between the selenium and sulfur species in these films,
(ii) only a slight increase In the open-circuit voltages of solar cell devices are achieved,
(iii) high temperatures and long reaction times of between 90 to 120 minutes are required to achieve significant degrees of S incorporation, which ultimately increases the costs of the production process; and
(iv) the resulting alloys are heterogeneous, which prohibit effective control over the lattice parameters and band gap values.

It has also been demonstrated, in an article by M. Marudachalam, H. Hichri, R. Klenk, R. W. Birkmire, W. N. Schfarman and J. M. Schultz, Appl. Phys. Lett. 67(26), 1995, 3978, that Cu(In,Ga)Se$_2$ thin films with improved homogeneity can be produced by the in-situ annealing of a phase-separated mixture of CuInSe$_2$ and CuGaSe$_2$ in argon in the temperature range of 500° C. to 600° C. for 60 to 120 minutes. However, Auger depth profiling of these specific alloys still revealed substantial variations in the In and Ga concentrations with depth, indicative of heterogeneous alloys.

In addition, the carrying out of the post-annealing step in an inert atmosphere resulted in substantial losses of Se from the film, which necessitated a second annealing step in H$_2$Se/Ar. The additional post-annealing steps in an inert atmosphere as well as H$_2$Se/Ar not only compromise the reproducibility of the process, but also make it commercially unviable.

Single Stage Techniques

In another attempt to produce homogeneous pentenary alloys, a complex single-stage technique has been developed. In this technique, disclosed in an article by I. M. Kötschau, H. Kerber, H. Wiesner, G. Hanna and H. W. Schock, Proceedings of the 16th European Photovoltaic Solar Energy Conference, 1-5 May 2000, Glasgow, UK, pp 724-727, all the elements (Cu, In, Ga, Se and S) are co-evaporated at constant fluxes in high vacuum from individual sources.

This technique allows for the controlled incorporation of gallium and sulfur into the films and hence in a decrease in the lattice parameters of the alloys. The subsequent increase in the band gap values of the pentenary alloys ultimately resulted in an increase in the open-circuit voltages of completed solar cell devices. However, glancing incident angle x-ray diffraction (GIXRD) at incident angles between 0.40 and 50 revealed a significant shift in the lattice parameters between the surface and the bulk of the material. The authors attributed this phenomenon to a copper depletion at the surface of the layer, which confirmed that the alloys were compositionally graded rather than homogeneous.

It has now surprisingly been found by the inventor that the significant problems discussed above can at least partially be overcome or reduced by controlling the formation of the ternary alloys in the selenization step such that the selenization reaction does not proceed to completion to form fully reacted ternary alloys in the absence of binary alloys.

OBJECT OF THE INVENTION

It is an object of the invention to provide novel quaternary and pentenary alloys.

It is a further object of the invention to provide novel substantially homogeneous quaternary and pentenary alloys suitable for use as semiconductor films, whereby the use of such alloys at least partially minimises the associated disadvantages in respect of semiconductor films comprising heterogeneous alloys.

SUMMARY OF THE INVENTION

According to the present invention, there is provided a quaternary or higher group IB-IIIA-VIA alloy having the general formula (I):

$$A_{(B1-x}C_x)(D_{1-y}E_y)_2 \qquad (I)$$

wherein:
A is a group IB element;
B is a group IIIA element;
C is a group IIIA element, which is different to B;
D is a first group VIA element (hereinafter referred to as VI$_1$);
E is a second group VIA element (hereinafter referred to as VI$_2$); and
each of x and y independently may vary from 0 to 1, provided that x and y are not zero at the same time;

and the alloy being characterised by an x-ray diffraction pattern (XRD) having a main [112] peak at a 2θ angle (2θ$_{[112]}$) of from 26° to 28° for Cu radiation at 40 kV, wherein a glancing incidence x ray diffraction pattern (GIXRD) for a glancing angle of from 0.2° to 10° reflects an absolute shift in the 2θ$_{[112]}$ angle of less than 0.06°.

The alloy preferably has a crystal structure comprising a lattice of unit cells, wherein all crystallographic planes show a variance in d-spacing of less than 0.01.

In a preferred embodiment of the invention, the element concentration of elements A, B, C, D and E of the alloy, as characterised by XPS depth profiling, is substantially uniform through the alloy.

Pentenary Alloys

In one embodiment of the invention, A is Cu, B is In or Al, preferably In, C is Ga, D is Se and E is S. Both x and y are greater than 0.

Preferably the pentenary alloy has the formula (II):

$$Cu(In_{1-x}Ga_x)(Se_{1-y}S_y)_2 \qquad (II)$$

In a preferred embodiment of the invention, x may vary from 0.25 to 0.3 and y may vary from 0.05 to 0.8.

The alloy of formula (II) preferably has a crystal structure comprising a lattice of unit cells, wherein all crystallographic planes show a variance in d-spacing of less than 0.001.

Preferably the absolute shift in the $2\theta_{[112]}$ angle is less than $0.01°$.

Preferably, the concentration of Cu, In, Ga, Se and S is constant through the depth of the alloy as characterised by XPS depth profiling.

In a preferred embodiment of the invention, the alloy of formula (II) may be characterised by an x-ray diffraction pattern (XRD) having a main [112] peak at a $2\theta$ angle ($2\theta_{[112]}$) of from $26.9°$ to $28°$ for Cu radiation at 40 kV, taken at a d-spacing of from 3.3117 to 3.1840

Preferably the $2\theta_{[112]}$ peak is substantially symmetrical. In a preferred embodiment of the invention the $2\theta_{[112]}$ peak may be from $27.0°$ to $27.5°$.

The alloy of formula (II) may further be characterised in that its band gap may be continuously shifted from 1 eV to 2.4 eV, preferably from 1.1 eV to 1.5 eV.

In a preferred embodiment of the invention, the atomic ratio of S to Se+S, i.e. the sulphur content expressed by $$\frac{S}{(S+Se)},$$

lies from 0.05 to 0.7.

In a preferred embodiment of the invention, the alloy of formula (II) is homogeneous.

Quaternary Alloys

Cu(In,Ga)Se$_2$

In another embodiment of the invention, A is Cu, B is In, C is Ga, D is Se and y=0.

Preferably the quaternary alloy has the formula (III):

$$Cu(In_{1-x}Ga_x)(Se)_2 \qquad (III)$$

In a preferred embodiment of the invention, x may vary from 0.25 to 0.3.

The alloy of formula (III) preferably has a crystal structure comprising a lattice of unit cells, wherein all crystallographic planes show a variance in d-spacing of less than 0.006.

Preferably the absolute shift in the $2\theta_{[112]}$ angle is less than $0.05°$.

Preferably, the concentration of Cu, In, Ga and Se is constant through the depth of the alloy as characterised by XPS depth profiling.

In a preferred embodiment of the invention, the alloy of formula (III) may be characterised by an x-ray diffraction pattern (XRD) having a main [112] peak at a $2\theta$ angle ($2\theta_{[112]}$) of from $26.8°$ to $27°$ for Cu radiation at 40 kV, taken at a d-spacing of from 3.3236 to 3.2990.

Preferably the $2\theta_{[112]}$ peak is substantially symmetrical. In a preferred embodiment of the invention the $2\theta_{[112]}$ peak may be from $26.85°$ to $26.9°$.

The alloy of formula (III) may further be characterised in that its band gap may be shifted from 1.1 eV to 1.2 eV, preferably from 1.15 eV to 1.18 eV.

In a preferred embodiment of the invention, the atomic ratio of Ga to Ga+In, i.e. the gallium content expressed by $$\frac{Ga}{(Ga+In)},$$

lies from 0.25 to 0.3.

In a preferred embodiment of the invention, the alloy of formula (III) is substantially homogeneous.

CuIn(Se, S)$_2$

According to yet a further embodiment of the invention, A is Cu, B is In, D is Se, E is S and x=0.

Preferably the quaternary alloy has the formula (IV):

$$CuIn(Se_{1-y}S_y)_2 \qquad (IV)$$

In a preferred embodiment of the invention, y may vary from 0.1 to 0.5.

The alloy of formula (IV) preferably has a crystal structure comprising a lattice of unit cells, wherein all crystallographic planes show a variance in d-spacing of less than 0.007 Preferably the shift in the $2\theta_{[112]}$ angle is less than $0.06°$.

Preferably, the concentration of Cu, In, Se and S is constant through the depth of the alloy as characterised by XPS depth profiling.

In a preferred embodiment of the invention, the alloy of formula (IV) may be characterised by an x-ray diffraction pattern (XRD) having a main [112] peak at a $2\theta$ angle ($2\theta_{[112]}$) of from $26.80°$ to $27.3°$ for Cu radiation at 40 kV, taken at a d-spacing of from 3.3236 to 3.2640.

Preferably the $2\theta_{[112]}$ peak is substantially symmetrical. In a preferred embodiment of the invention the $2\theta_{[112]}$ peak may be from $27.0°$ to $27.2°$.

The alloy of formula (IV) may further be characterised in that its band gap may be shifted from 1.05 eV to 1.23 eV, preferably from 1.15 eV to 1.20 eV.

In a preferred embodiment of the invention, the atomic ratio of S to S+Se, i.e. the S content expressed by $$\frac{S}{(S+Se)},$$

lies from 0.1 to 0.5.

In a preferred embodiment of the invention, the alloy of formula (IV) is substantially homogeneous.

According to another aspect of the invention, there is provided a semiconductor film including an alloy of formula (I). The semiconductor film preferably includes a support for the alloy of formula (I), preferably a substrate.

In a preferred embodiment of the invention, the substrate may include a metal layer thereon. The metal layer may preferably be a Mo layer.

The semiconductor film comprising the alloy of formula (I) may have a thickness of from 1.5 to 2.0 μm.

According to yet a further aspect of the invention, there is provided a photovoltaic/solar cell including a semiconductor film including an alloy of formula (I). In a preferred embodiment of the invention, the photovoltaic/solar cell has a conversion efficiency of from 8 to 15%.

According to still a further aspect of the invention, there is provided a method for producing a group IB-IIIA-VIA quaternary or higher alloy semiconductor film, the method comprising the steps of:

i. providing a metal film comprising a mixture of group IB and group IIIA metals;
ii. heat treating the metal film in the presence of a source of a first group VIA element (said first group VIA element hereinafter being referred to as $VIA_1$) under conditions to form a first film comprising a mixture of at least one binary alloy selected from the group consisting of a group $IB-VIA_1$ alloy and a group $IIIA-VIA_1$ alloy and at least one group $IB-IIIA-VIA_1$ ternary alloy;
iii. optionally heat treating the first film in the presence of a source of a second group VIA element (said second group VI element hereinafter being referred to as $VIA_2$) under conditions to convert the first film into a second film comprising at least one alloy selected from the group consisting of a group $IB-VIA_1-VIA_2$ alloy and a group $IIIA-VIA_1-VIA_2$ alloy; and the at least one group $IB-III-VIA_1$ ternary alloy of step (ii);
iv. heat treating either the first film or second film to form a group IB-IIIA-VIA quaternary or higher alloy semiconductor film, wherein VIA may be $VIA_1$ and/or $VIA_2$.

Preferably the mixture of the first film is a stable mixture wherein the molar ratio of all the group $IB-VIA_1$ and/or group $IIIA-VIA_1$ alloys to the at least one group $IB-IIIA-VIA_1$ ternary alloy remains substantially constant.

Step (i)

The metal film of step (i) may be provided on a substrate, which substrate is preferably inert under the reaction conditions and heat treatment steps of the above method. Suitable substrates include glass, flexible metallic or polymer foils or the like. Preferably, the substrate is from 0.05 mm to 3.0 mm thick.

The substrate may optionally be coated with a metal layer, preferably a Mo layer having a thickness of 0.5 to 1.0 m. Preferably, the metal film is provided on the metal layer. The metal layer may also serve as an electrical contact layer in a photovoltaic cell.

The metal film of step (i) includes a mixture of metals, and in one embodiment preferably comprises at least two different group IIIA metals.

In a preferred embodiment of the invention, the metal film of step (i) comprises a mixture of metals selected from the group consisting of Cu, In and Ga, preferably a combination of Cu, In and Ga, which metals may be in elemental form or in the form of an alloy. Preferably the source of Cu and Ga is an alloy, preferably $Cu_{0.75}Ga_{0.25}$ alloy. Preferably the metal film is a Cu—In—Ga alloy. Other group III elements of interest in addition to Ga are Al and Th.

In another embodiment of the invention, the metal film of step (i) comprises a mixture Cu and In only in the absence of Ga. Preferably the metal film is a Cu—In alloy.

In a preferred embodiment of the invention, the total amount of group IIIA elements deposited on the substrate will be sufficient to provide a molar ratio of group IB to group IIIA elements, for example Cu/(In+Ga) which ranges from 0.7 to 1.0, preferably from 0.8 to 1.0, and more preferably 0.90 to 0.95.

The metals may be deposited onto the substrate by techniques well know in the art, such as direct current (DC) magnetron sputtering, to form the metal film which may be 0.6 to 1 m thick, preferably 0.6 m thick. It will be appreciated that there are other means by which the group IB and group IIIA metals, or alloys thereof, may be deposited onto the substrate such as for example by means of electro-deposition or electron-beam evaporation.

Step (ii)

The metal film of step (i) is heat treated in the presence of a source of $VIA_1$. Preferably $VIA_1$ is Se. More preferably the source comprises a gaseous mixture of $H_2Se$ and preferably at least one other gas, preferably an inert gas such as Ar. It is also envisaged that elemental Se in vapour form may also be used.

The molar concentration of Se relative to the at least one other gas, preferably Ar, may be from 0.01 to 15 molar percentage, preferably from 0.1 to 1.0 molar percentage and most preferably the concentration of Se relative to the at least one other gas is 0.12%.

In one embodiment of the invention step (ii) is carried out under reaction conditions wherein the reaction temperature is from 300° C. to 500° C., preferably from 350° C. to 450° C.

In a preferred embodiment of the invention, the metal film of step (i) is heated to the reaction temperatures set out above within 5 to 30 minutes, preferably within 10 to 20 minutes.

Preferably, the metal film of step (i) is exposed to the source of the $VIA_1$ element for a period of from 10 to 120 minutes, preferably 15 to 90 minutes and more preferably between 30 to 60 minutes. The pressure during step (ii) is maintained between $10^4$ Pa and $10^5$ Pa, preferably from $5\times10^4$ Pa to $9\times10^4$ Pa.

In one embodiment of the invention, the metal film of step (i) is heat treated in the presence of a source of Se to form a first film comprising a stable mixture of binary alloys, comprising CuSe, InSe and $Ga_2Se_3$ and the at least one group IB-IIIA-VIA ternary alloy.

Preferably the first film of step (ii) has below 50 atomic percent of the $VIA_1$ element. More preferably, the first film is Se deficient in that the first film has below 50 atomic percent of Se. Preferably the first film comprises a Se concentration of from 43-47 atomic %, relative to 50 atomic percent required for stoichiometric fully reacted films. Preferably the Se/(Cu+Ga+In) ratio is below 1.

In a preferred embodiment of the method as defined above, and after having carried out step (ii) according to the invention, the first film may be subjected to a treatment step under conditions to ensure that the mixture of binary alloys and the at least one group IB-IIIA-VIA ternary alloy remains stable.

Preferably, the conditions include the removal of the source of the $VIA_1$ element thereby to maintain the stability of the mixture. In a preferred embodiment, the conditions may also include the exposure of the first film to an inert atmosphere, preferably Ar, for a period of from 5 to 20 minutes, preferably 10 to 15 minutes. The first film may also be cooled, preferably to temperatures below 200° C.

Method for the Formation of a Group IB-IIIA-VIA Pentenary Alloy Semiconductor Film.

Step (i) and (ii)

Steps (i) and (ii) are as set out above. More particularly, step (i) comprises providing a metal film including a mixture of at least one group IB element, a first group IIIA element (the first group IIIA element hereinafter being referred to as $IIIA_1$) and a second group IIIA element (the second group IIIA element hereinafter being referred to as $IIIA_2$). Step (ii) comprises heat treating the metal film of step (i) in the presence of a source of $VIA_1$ under conditions to form a first film comprising a mixture of binary alloys selected from the group consisting of a group $IB-VIA_1$ alloy, a group $IIIA_1-VIA_1$ alloy and a group $IIIA_2-VIA_1$ alloy and two ternary alloys, namely a group $IB-IIIA_1-VIA_1$ alloy and a group $IB-IIIA_2-VIA_1$ alloy.

Step (iii)

In one embodiment of the invention, the first film of step (ii) is heat treated in the presence of a source of a second group $VIA_2$ element, preferably so as to convert the first film into a second film comprising at least one alloy selected from the group consisting of a group $IB-VIA_1-VIA_2$ alloy and a group IIIA-VIA$_1$-VIA$_2$ alloy, preferably a group IIIA$_1$-VIA$_1$-VIA$_2$ alloy and a group IIIA$_2$-VIA$_1$-VIA$_2$ alloy; and the at least one group IB-IIIA-VIA$_1$ ternary alloy of step (ii).

Preferably VIA$_2$ is a source of S. In a preferred embodiment of the invention, the source of S comprises a gaseous mixture of H$_2$S and at least one inert gas, preferably an inert gas such as Ar.

In a preferred embodiment of the invention, the molar concentration of S relative to the at least one inert gas, preferably Ar, may be from 0.1 to 10 molar percent, preferably from 0.3 and 0.5 molar percent, most preferably the concentration of S relative to the at least one other gas is 0.35%.

The heat treatment of step (iii) may be at a temperature from 100° C. to 500° C., preferably 400° C. to 500° C., more preferably 450° C. for a period from 5 to 10 minutes, preferably 5 minutes.

In a preferred embodiment of the invention, the group IB element is Cu, the group IIIA$_1$ element is In, the group IIIA$_2$ element is Ga, VIA$_1$ is Se and VIA$_2$ is S.

Preferably the second film comprises a mixture of alloys selected from the group consisting of Cu(Se,S), In(Se,S) and Ga(Se,S), preferably all three of them, and the ternary alloys, namely CuGaSe$_2$ and CuInSe$_2$, preferably both of them.

Step (iv)

In a preferred embodiment of the invention, the second film of step (iii) may be annealed, preferably in the presence of a source of S, for a period from 5 to 10 minutes, preferably 5 minutes at a temperature from 450° C. to 600° C., preferably 500° C. to 550° C., more preferably 500° C., such that at least one of the alloys selected from the group consisting of a group IB-VIA$_1$-VIA$_2$ alloy, a group IIIA$_1$-VIA$_1$-VIA$_2$ and a group IIIA$_2$-VI$_1$-VI$_2$ alloy react with the at least one group IB-IIIA-VIA$_1$ ternary alloy of step (ii) to form a third film comprising mixture of group IB-IIIA-VIA quaternary alloys comprising either two group IIIA metals or two group VIA elements, namely VIA$_1$ and VIA$_2$.

More preferably the third film comprises a mixture of quaternary alloys selected from the group consisting of a group IB-IIIA$_1$-VI$_1$-VIA$_2$ alloy and a group IB-IIIA$_2$-VIA$_1$-VIA$_2$ alloy. More preferably, the third film comprises a mixture of CuIn(Se,S)$_2$ and CuGa(Se,S)$_2$. The quaternary alloys of CuIn(Se,S)$_2$ and CuGa(Se,S)$_2$ are preferably substantially homogeneous.

Preferably the third film is annealed for 15 to 90 minutes, more preferably 30 minutes to a temperature of from 500° C. to 600° C., preferably 520° C. to 580° C., more preferably at 550° C. to form a pentenary alloy having the general formula II:

$$Cu(In_{1-x}Ga_x)(Se_{1-y}S_y)_2 \qquad (II)$$

wherein preferably x may vary from 0.1 and 0.5, preferably from 0.25 and 0.3 and y may preferably vary from 0 and 1, more preferably from 0.05 and 0.7.

The pentenary alloy is preferably homogeneous and may preferably be annealed for an additional period of time, preferably 15 minutes to optimise the structural properties of the alloy. The homogeneous film may be from 1.5 m to 2.0 m thick.

Method for the Formation of a Group IB-IIIA-VIA Quaternary Alloy Semiconductor Film.

Cu(In,Ga)Seth 2 Quaternary Alloy Semiconductor Films

Step I and Step II

Step i and step ii are as set out above. More particularly, step (i) comprises providing a metal film including a mixture of at least one group IB element, a IIIA$_1$ element and a IIIA$_2$ element. Step (ii) comprises heat treating the metal film of step (i) in the presence of a source of VIA$_1$ under conditions to form a first film comprising a mixture of binary alloys selected from the group consisting of a group IB-VIA$_1$ alloy, a group IIIA$_1$-VIA$_1$ alloy and a group IIIA$_2$-VIA$_1$ alloy and a ternary alloy being a group IB-IIIA$_1$-VIA$_1$ alloy.

In a preferred embodiment of the invention, step (ii) is carried out at a temperature of 350° C. to 450° C., preferably 400° C. such that the first film comprises a stable mixture of binary alloys, selected from the group consisting of CuSe, InSe and Ga$_2$Se$_3$, wherein IB is Cu, IIIA$_1$ is In, IIIA$_2$ is Ga and VIA$_1$ is Se; and a single ternary alloy, namely CuInSe$_2$. Preferably, the formation of CuGaSe$_2$ is impeded.

Step (iv)

In one embodiment of the invention, the first film of step (ii) is subjected to a first heat treatment step and then to a second heat treatment step so as to form a group IB-IIIA$_1$-IIIA$_2$-VIA$_1$ element.

In a preferred embodiment of the invention, the first heat treatment step of step (iv) comprises heating the first film of step (ii) to a reaction temperature of from 100° C. to 600° C. in the presence of an inert gas, preferably an Ar containing atmosphere. Preferably the first film of step (ii) is heated to the reaction temperature within 5 minutes.

The second heat treatment step of step (iv) comprises first annealing the first film in the presence of an inert atmosphere, preferably in the presence of Ar. Preferably the first film of step (ii) is first annealed in the presence of an Ar containing atmosphere, preferably at a temperature of from 100° C. to 600° C., preferably from 200° C. to 550° C., more preferably from 500° C. and 550° C. for 10 to 60 minutes, preferably from 15 to 30 minutes and is then secondly annealed in the presence of a source of a VIA$_1$ element.

VIA$_1$ is preferably Se as in step ii. The first film of step (ii) is annealed in the presence of a source of Se for preferably 10 to 60 minutes, more preferably 30 minutes to a temperature of from 100° C. to 600° C., preferably 200° C. to 550° C., more preferably at 500° C. to form a quaternary alloy of formula (III), wherein IB is Cu, IIIA$_1$ is In, IIIA$_2$ is Ga and VIA$_1$ is Se:

$$Cu(In_{1-x}Ga_x)Se_2 \qquad (III)$$

and wherein x may vary from 0.25 to 0.30.

Preferably the source of Se is an atmosphere of H$_2$Se and at least one other gas, preferably an inert gas such as Ar. Preferably the molar concentration of Se relative to the at least one other gas is 0.12%.

In a preferred embodiment of the invention, the first film (ii) is subjected to the following consecutive steps;

(a) heating the first film in a reaction tube in an inert atmosphere of Ar to a reaction temperature of 500° C. for 5 minutes;

(b) annealing the first film in the reaction tube in an Ar containing atmosphere at 500° C. for at least 15 minutes;

(c) annealing the first film in the presence of 0.12 molar percent of H$_2$Se in Ar for 30 minutes at 500° C.

Preferably the quaternary alloy of formula (III) is homogeneous.

CuIn(Se,S)$_2$ Quaternary Alloy Semiconductor Films

Step (i) and (ii)

Step (i) and (ii) are the same as above. More particularly, step (i) comprises providing a metal film including a mixture of at least one group IB element and a group IIIA element. Step (ii) comprises heat treating the metal film of step (i) in the presence of a source of VIA$_1$ under conditions to form a first film comprising a mixture of binary alloys selected from the group consisting of a group $IB\text{-}VIA_1$ alloy and a group $IIIA\text{-}VIA_1$ alloy and a ternary alloy being a group $IB\text{-}IIIA\text{-}VIA_1$ alloy.

In a preferred embodiment of the invention, IB is Cu, IIIA is In and $VIA_1$ is Se. The metal film of step (i) is preferably a Cu—In alloy.

In a preferred embodiment of the invention, the first film of step (ii) is subjected to a treatment step so as to ensure that the mixture of the binary alloys and the ternary alloy of step (ii) remains stable. Preferably the source of the $VIA_1$ element is removed. Also, the first film of step (ii) may be cooled to temperatures below 200° C.

Step (iii)

This step is not carried out.

Step (iv)

In one embodiment of the invention, the first film of step (ii) is subjected to a first heat treatment step and is then subjected to a second heat treatment step wherein the first film of step (ii) is annealed in the presence of a source of $VIA_2$ so as to form a group $IB\text{-}IIIA_1\text{-}VIA_1\text{-}VIA_2$ element.

The first heat treatment step of step (iv) comprises heating the first film of step (ii) to a reaction temperature from 100 to 600° C., preferably 200 to 550° C. and more preferably 500 to 550° C. for 10 to 60 minutes, preferably 15 to 30 minutes.

The first film of step (ii) is then annealed in the presence of a source of $VIA_2$.

$VIA_2$ is preferably S. The first film of step (ii) is annealed in the presence of a source of S for preferably 10 to 60 minutes, more preferably 30 minutes to a temperature of from 200° C. to 600° C., preferably 200° C. to 550° C., more preferably at 500° C. to form a quaternary alloy of formula (III), wherein IB is Cu, IIIA is In, $VIA_1$ is Se and $VIA_2$ is S:

$$CuIn(Se_{1-y}S_y)_2 \qquad (IV)$$

wherein y may vary from 0.1 to 0.5.

Preferably the source of S is an atmosphere of $H_2S$ and at least one other gas, preferably an inert gas such as Ar. Preferably the molar concentration of S relative to the at least one other gas is 0.35%.

In a preferred embodiment of the invention, the first film (ii) is subjected to the following consecutive steps;

(a) heating the first film in a reaction tube to a reaction temperature of 500° C. to 550° C. in 15 to 30 minutes; and (b) annealing the first film in the presence of a gaseous mixture of $H_2S$ and $Ar(g)$, wherein the molar concentration of S relative to $Ar(g)$ is 0.35 so as to form a quaternary alloy of formula (III).

Preferably the quaternary alloy of formula (IV) is homogeneous.

DETAILED DESCRIPTION OF THE INVENTION

Without thereby limiting the scope of the invention and by means of example only, embodiments of the invention will now be described by means of the following examples. In the examples reference is made to the accompanying figures:

FIG. 1 is schematic representation of the method for producing a group IB-IIIA-VIA pentenary alloy semiconductor film according to the invention;

FIGS. 2.1-2.2 are X-ray diffraction spectra of the first film formed according to step ii of example 1. More particularly FIG. 2.1 is an XRD pattern of the first film of sample 200250-a and FIG. 2.2 is an XRD pattern of the first film of sample 200251-a;

FIG. 3 are X-ray diffraction spectra corresponding to step (iii) and steps (iv)(a) and (iv)(b) according to example 1 for sample 200251-a, which spectra illustrate the transition from the ternary to the quaternary and pentenary alloy states for the sample;

FIGS. 4.1-4.2 are GIXRD patterns of the [112] peak positions of the pentenary alloy semiconductor films of samples 200251-a and 200250-a in example 1;

Figure 10:
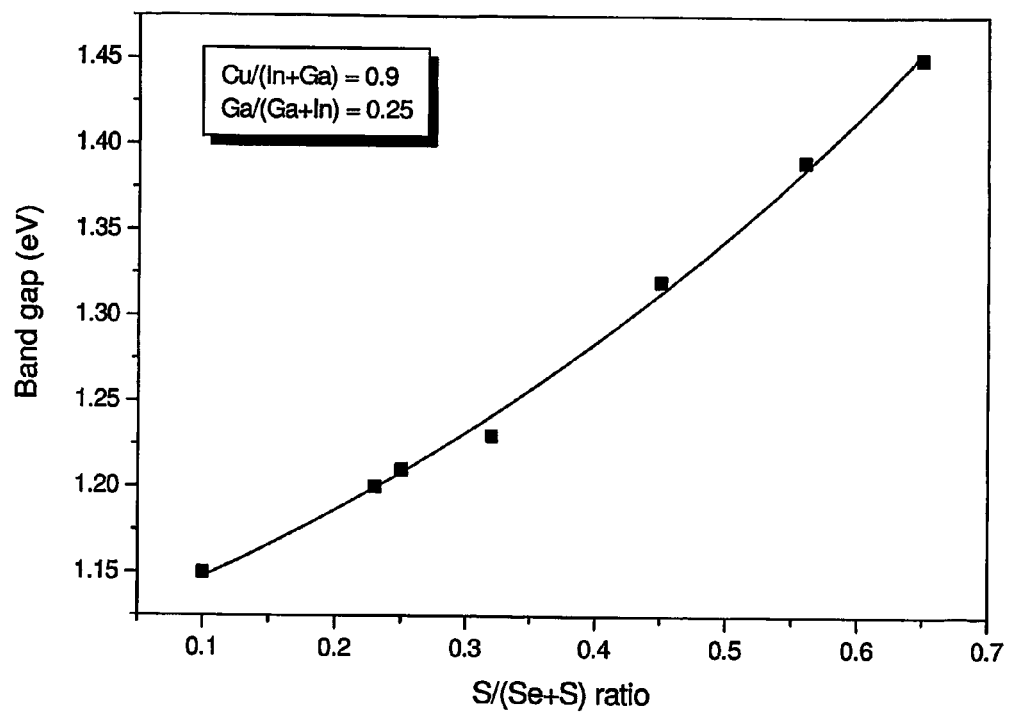
Figure 11:
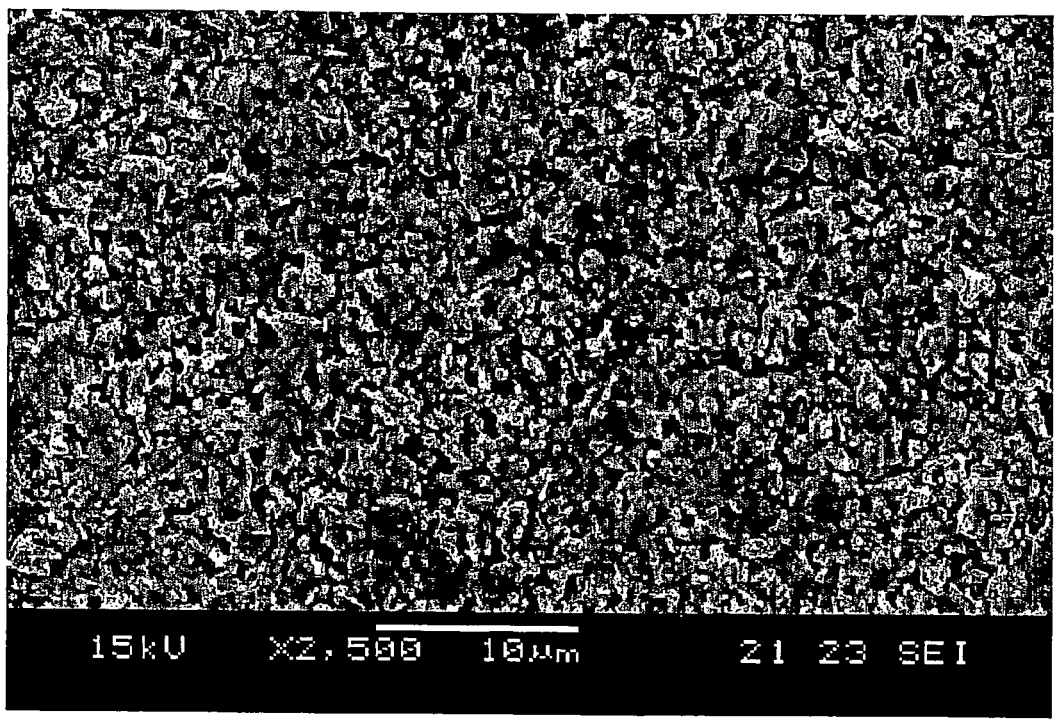
Figure 12:
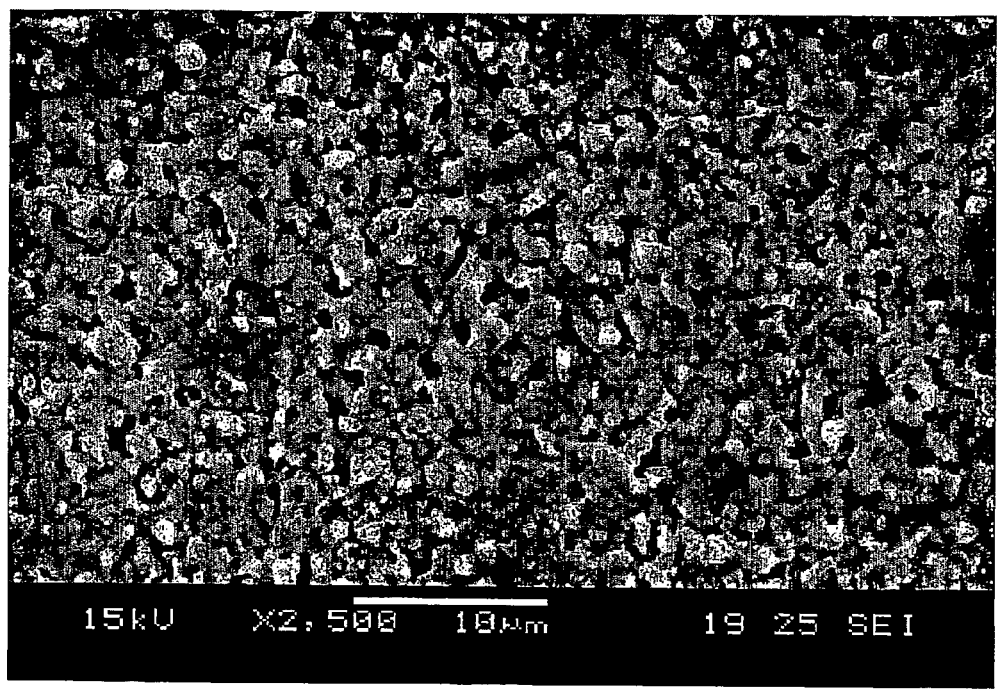
Figure 13:
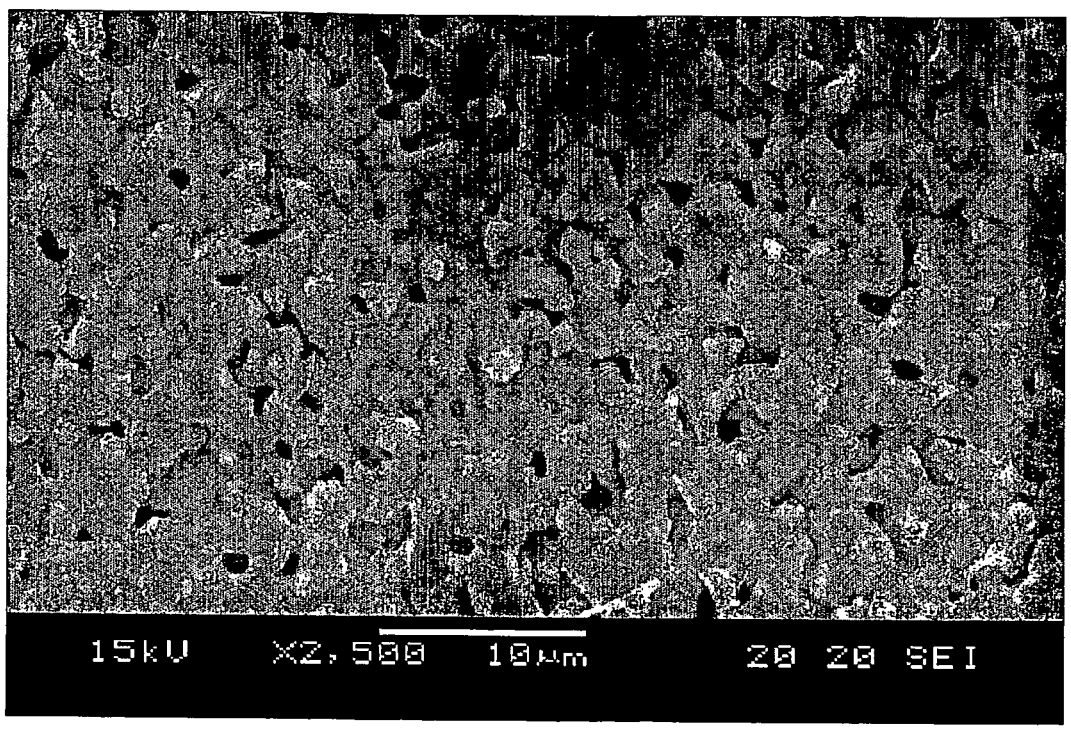
Figure 14:
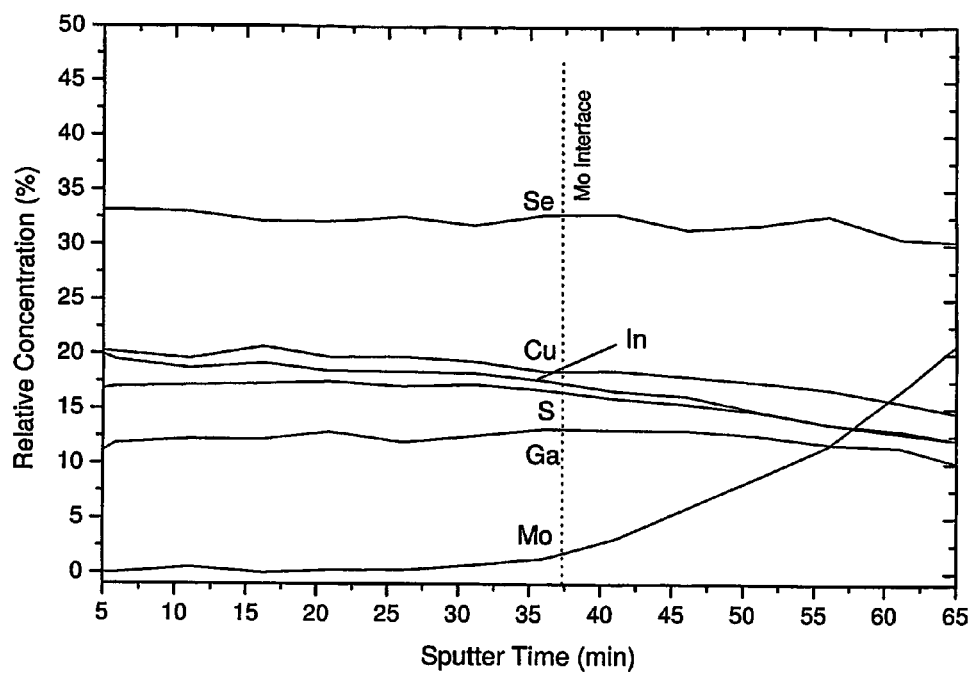
Figure 16:
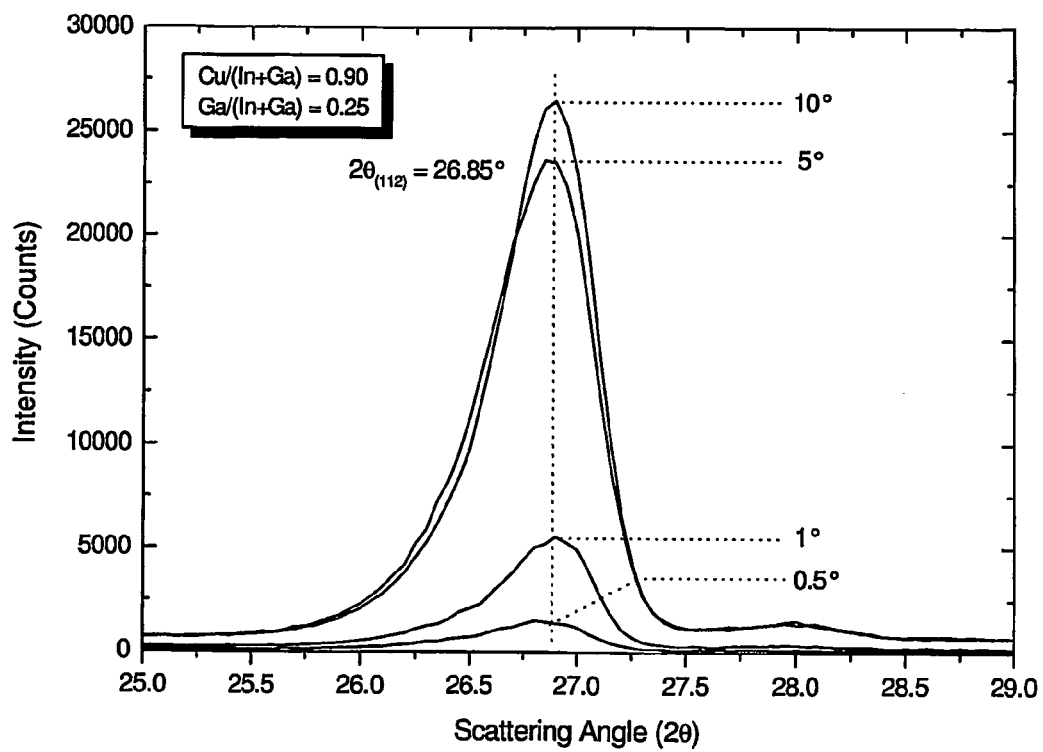
Figure 18:
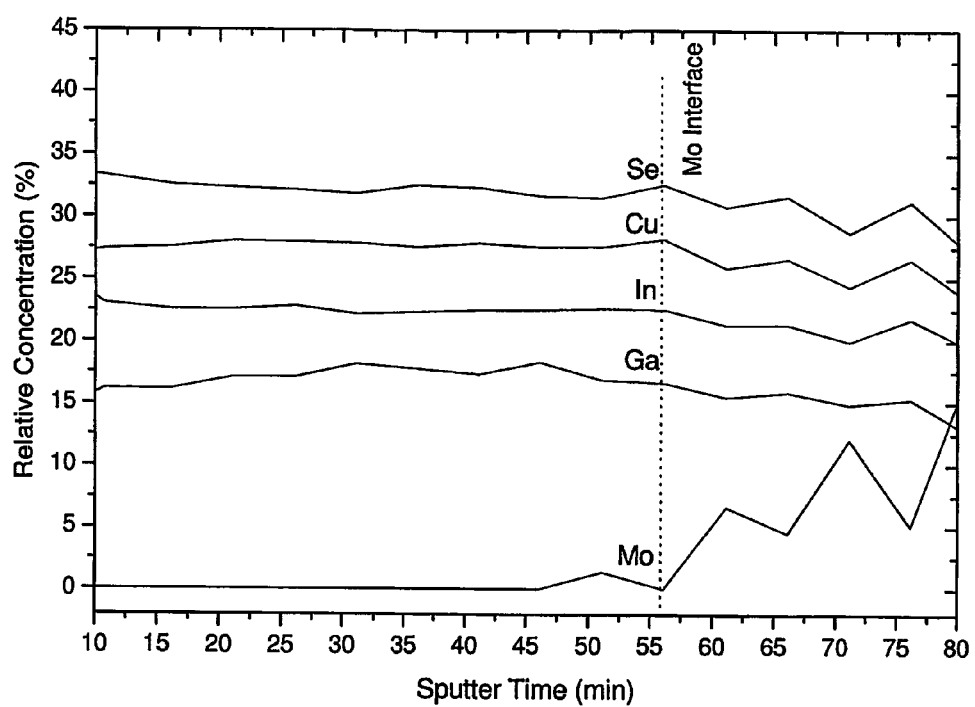
Figure 19:
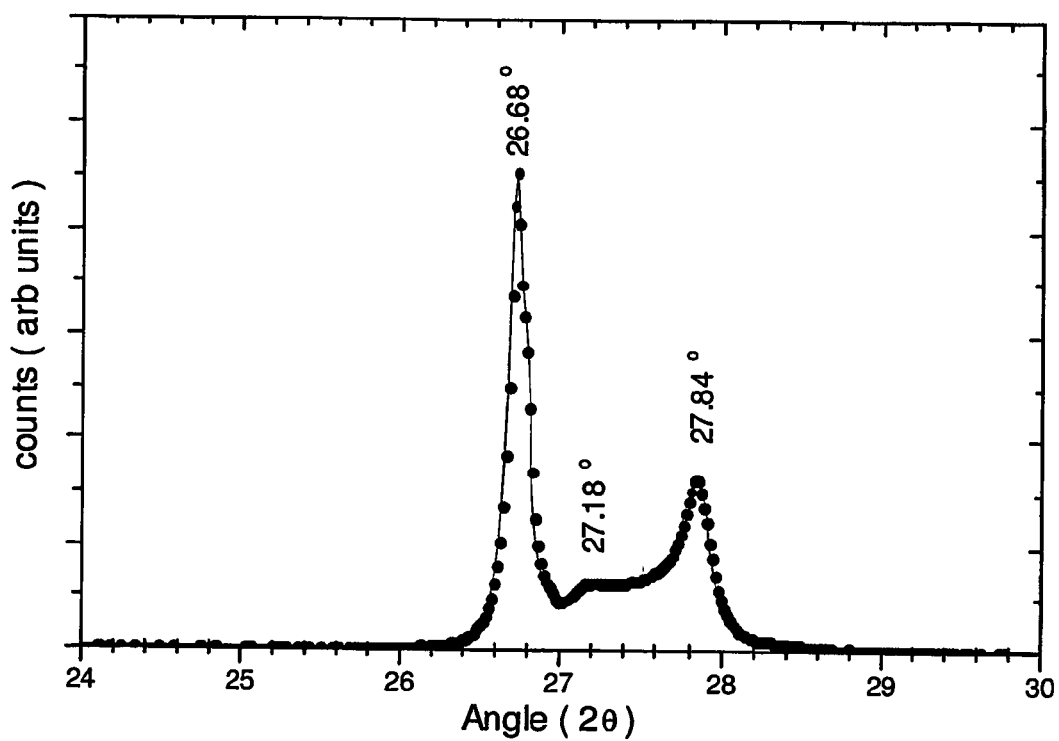
Figure 20:
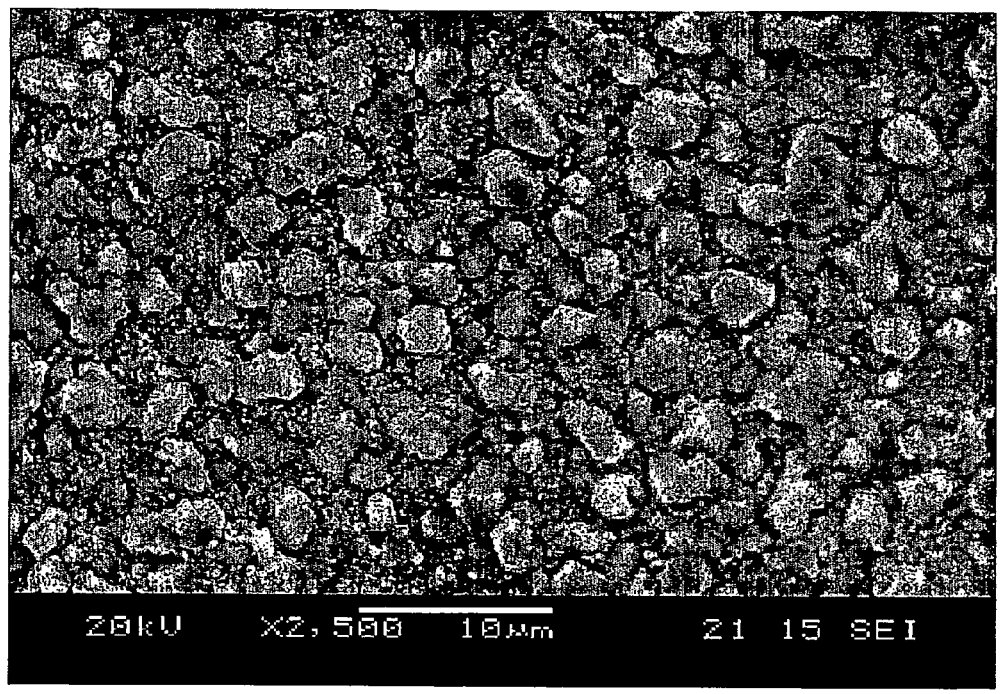
Figure 21:
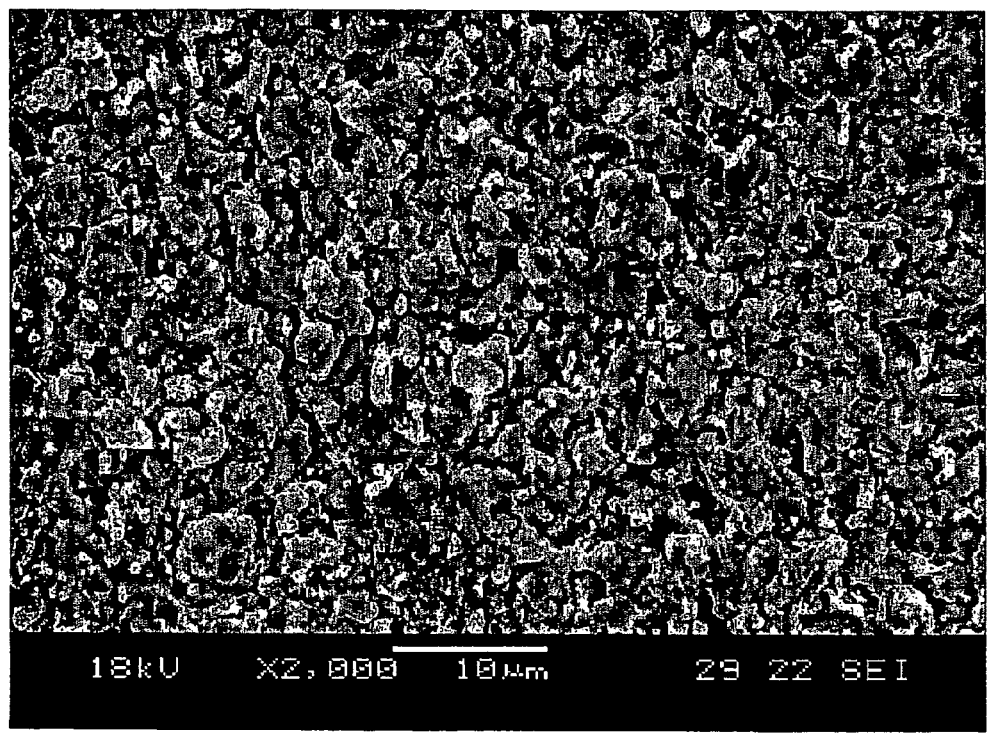
Figure 22:
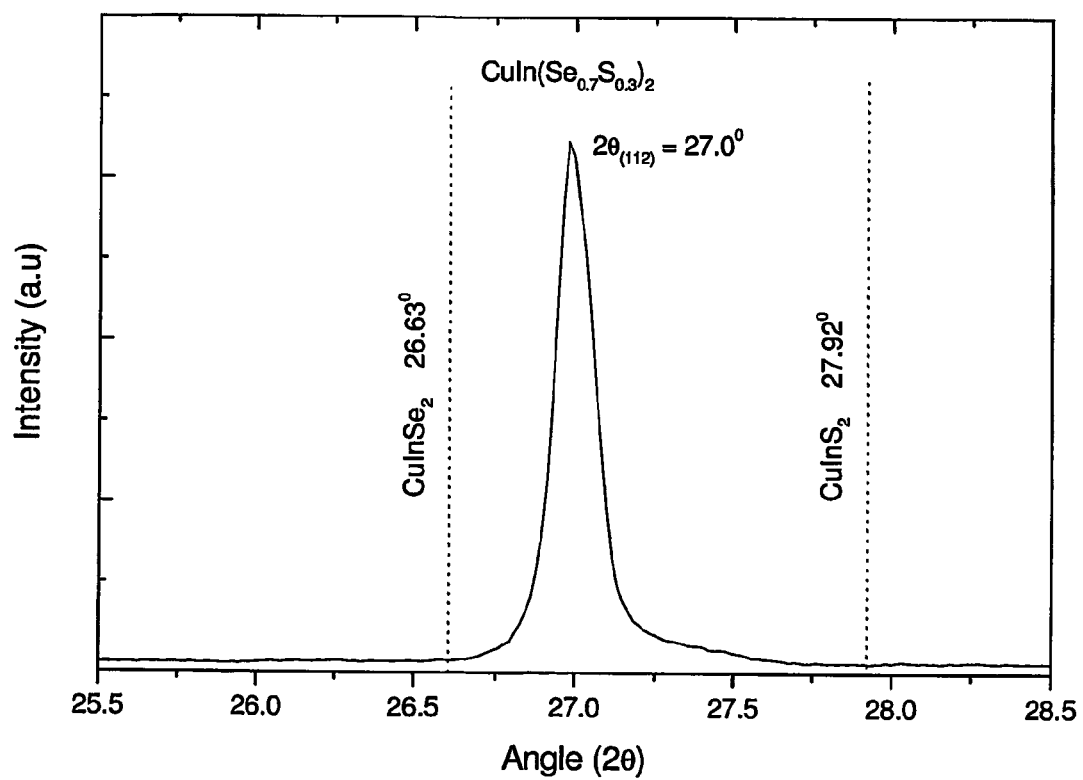
Figure 23:
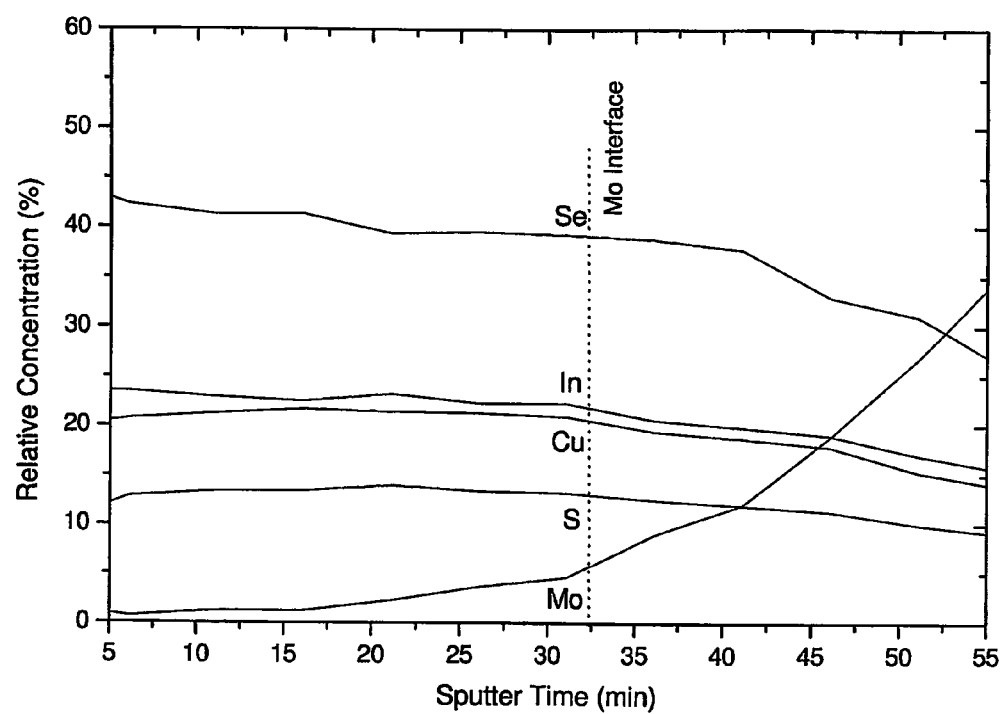
Figure 24:
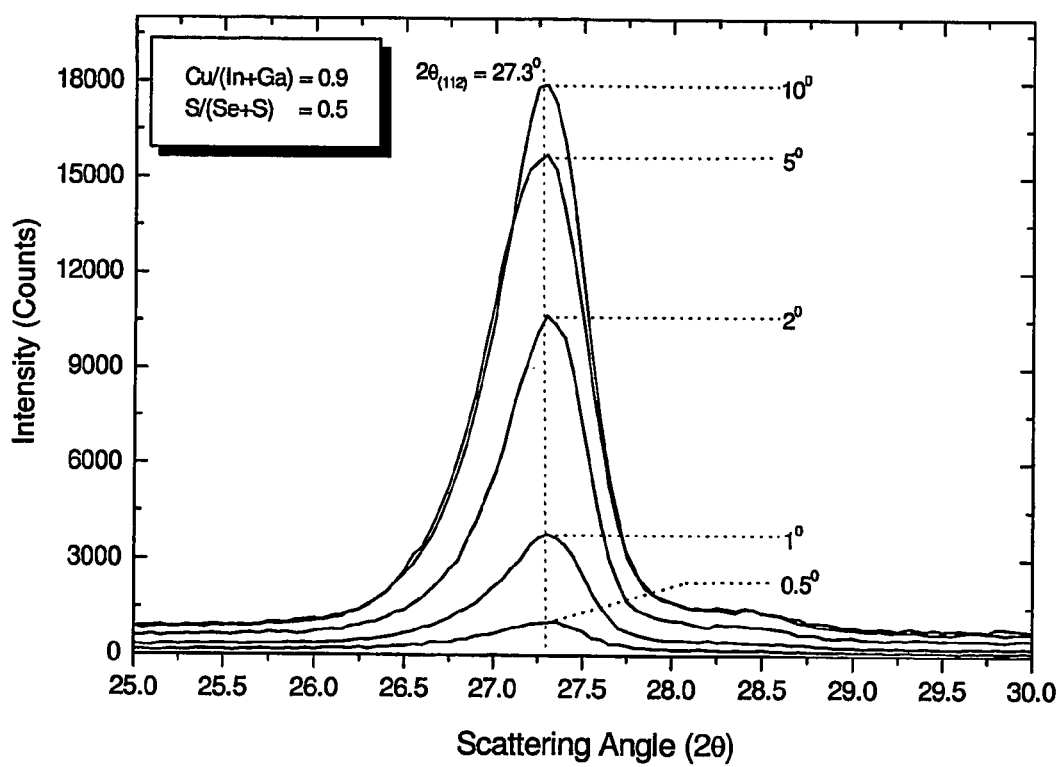

FIG. 10 Plot of band gap values as function of S/Se+S ratio for a series of homogeneous pentenary alloys, prepared according to the steps set out in Example 1;

FIGS. 11-13 are SEM micrographs depicting the surface morphology of a $Cu(In_{0.75}Ga_{0.25})(Se_{0.75}S_{0.25})_2$ alloy semiconductor film (sample 200251-a), a $Cu(In_{0.75}Ga_{0.25})(Se_{0.6}S_{0.4})_2$ alloy semiconductor film (sample 200250-a) and a $Cu(In_{0.75}Ga_{0.25})(Se_{0.3}S_{0.7})_2$ alloy semiconductor film (sample 200378-a) of example 1;

FIG. 14 a XPS concentration depth profile of a pentenary alloy of example 1, and more particularly, a concentration profile of sample 200251-a;

FIG. 15.1-15.2 are XRD patterns of a quanternary alloy prepared under the prior art conditions specified in example 2 and a quaternary alloy of example 2, specifically of sample 200259-a;

FIG. 16 is a GIXRD patterns of the [112] peak position of sample 200259-a of example 2;

FIG. 17.1-17.2 are X-ray fluorescence profiles depicting the in-depth composition properties of the quaternary alloy prepared under the prior art conditions specified in example 2 and sample 200259-a of example 2 respectively;

FIG. 18 a XPS concentration depth profile of a quaternary alloy of example 2, and more particularly, a concentration profile of sample 200259-a;

FIG. 19 is an XRD pattern of a quaternary alloy prepared under the prior art conditions described in example 3;

FIG. 20 is a SEM micrograph depicting the surface morphology of the quaternary alloy prepared under the prior art conditions described in example 3;

FIG. 21 is a SEM micrograph depicting the surface morphology of sample 200259-c of example 3;

FIG. 22 is an XRD patterns of sample 200259-c of example 3;

FIG. 23 a XPS concentration depth profile of a quaternary alloy of example 3, and more particularly, a concentration depth profile of sample 200258-b;

FIG. 24 is a GIXRD patterns of the [112] peak position of sample 200263-b of example 3.

The following methods and their respective conditions were used in characterising the group IB-IIIA-VIA alloys of the invention:

1. XPS: The concentration profiles of the samples were determined by X-ray photoemission spectroscopy (XPS) using a Physics Electronics (PHI) Quantum 2000 Scanning XPS system using Al Kα radiation at 20 W beam energy. The spot size was 100 μm and the argon ion gun operates at 2 kV.

2. XRD: The X-ray diffraction (XRD) scans were recorded using a Phillips X'pert diffraction system with Cu Kα radiation (0.154056 A) at 40 kV and 40 mA.

3. SEM: A Jeol JSM 5600 scanning electron microscope (SEM) equipped with a Noran EDS at 20 kV with a vertical incident beam at 20 kV was used for studying the morphology and composition of the films respectively.

4. GIXRD: The lattice parameters as function of sample depth was determined by glancing incident angle XRD (GIXRD) on a Phillips X'pert PW3040-MPD system with Cu Kα radiation (0.154056 Å) at 40 kV and 40 mA.

5. Solar cell devices were measured under standard A.M. 1.5 (100 mW cm$^{-2}$) condition at 25° C. The spectral responses of the respective devices were determined from quantum efficiency measurements. The corresponding band gap values of the absorber films were derived from the long wavelength cut-off values of the spectral response measurements.

General Experimental Procedure

It is well known to those skilled in the art that photovoltaic cells include a substrate for supporting a semiconductor film, in this case a group IB-IIIA-VIA alloy semiconductor film. Typically, any suitable substrate may be used, which substrate does not react with the semiconductor film and which does not modulate the semiconductor properties. Suitable substrates include glass, flexible metallic or polymer foils and the like.

The substrate may have a thickness of 0.05 to 3.0 mm and is often coated with a metal layer of molybdenum in order to enhance the adhesion of a resultant semiconductor film to the substrate and to serve as a contact in a completed photovoltaic device.

The thickness of the Mo coating is usually between 0.5 to 1.0 m and is deposited onto the substrate by DC magnetron sputtering at a working pressure of between 0.1 to 0.8 Pa. It will be appreciated that there are many other techniques known in the art which relate to the use and deposition of metal layers, for example there may be more than one layer, or chromium may be used in place of molybdenum.

Step (i)

For purposes of the experiment, a 2 mm thick soda lime glass substrate was used. The substrate was cleaned in an ultrasonically stirred soap solution for 10 minutes by gently moving the substrate placed in a holder. The substrate was then held under a cold deionised water tap for a few minutes to ensure the removal of excess soap thereon. Thereafter, the substrate was cleaned in an ultrasonically stirred deionised hot water bath by gently moving the substrate holder. Finally, the substrate was dried for 10 minutes in dry-nitrogen in an oven maintained at 1200° C.

Once dried, a Mo layer was deposited onto the substrate. This was followed by co-sputtering the metal film of Cu, Ga and In onto the Mo layer for the preparation of a Cu(In$_{1-x}$Ga$_x$)Se$_2$ alloy semiconductor film and a Cu(In$_{1-x}$Ga$_x$)(Se$_{1-y}$S$_y$)$_2$ alloy semiconductor film. In the case for the preparation of a CuIn(Se$_{1-y}$S$_y$)$_2$ alloy semiconductor film, Cu and In were co-sputtered onto the substrate. The deposition of Mo and the co-sputtering were carried out in a DC magnetron sputtering unit consisting of a deposition chamber which accommodates three 9 inch circular cathodes (targets): Mo, pure In and a Cu$_{0.75}$Ga$_{0.25}$ alloy target, or in the case for the preparation of a CuIn(Se$_{1-y}$S$_y$)$_2$ alloy semiconductor film, the targets were Mo, Cu and In.

The deposition chamber was evacuated to a base pressure of 5×10$^{-5}$ Pa for at least three hours. The Mo layer was deposited without any intentional heating of the substrate at a working pressure of 0.5 Pa to 0.7 Pa, using Ar as plasma gas. The total thickness of the Mo layer was 1 μm.

EXAMPLE 1

Figure 1:
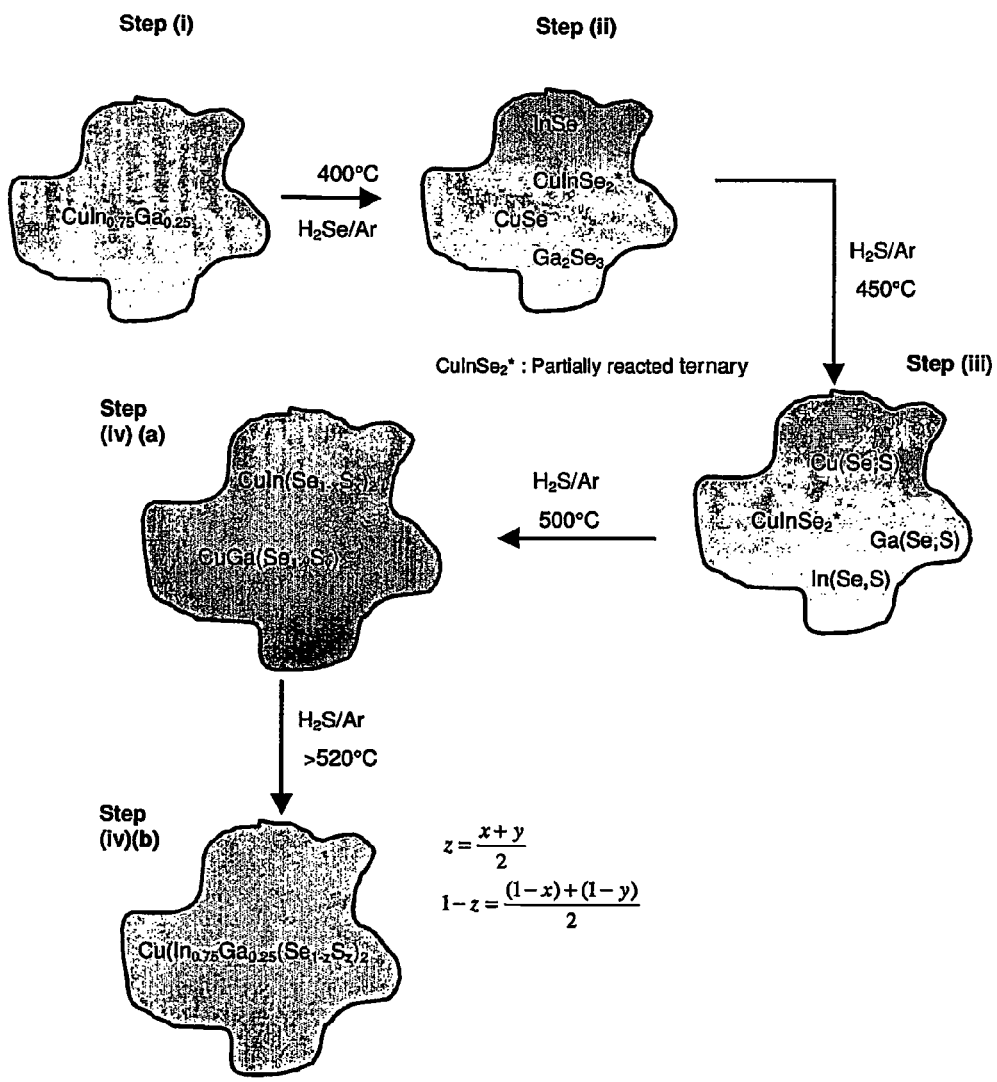

Experimental Procedure for the Production of a Group IB-IIIA-VIA Pentenary Alloy FIG. 1 is a schematic representation of the method according to the invention for the production of a group IB-IIIA-VIA pentenary alloy semiconductor film.

Step i

Step (i) was followed as set out under the general experimental procedure. More particularly, the deposition of the Mo layer was followed, without breaking vacuum, by the co-sputtering of Cu$_{0.75}$Ga$_{0.25}$ and In at a working pressure of 0.3 Pa. The co-sputtering of the metals, Cu, In and Ga, was also carried out without intentional substrate heating and the substrate was rotated during co-sputtering in order to enhance the mixing of the Cu—Ga—In alloy. The total thickness of the Cu—In—Ga alloys was 0.6 μm and the Cu/(In+Ga) and Ga/(Ga+in) atomic ratios were maintained at 0.9 and 0.25 respectively.

Step ii

The substrate with the co-sputtered metal film of step i was placed in a horizontal quartz tube reactor (herein after referred to as the reactor tube). The substrate was laid on a graphite substrate holder and placed in the reactor tube. Graphite substrate holders were used to ensure the uniform heating of the substrate.

The reactor tube was evacuated to a pressure of 2.67×10$^{-4}$ Pa for at least two hours before carrying out step ii. The reaction tube was then pressurised and a constant Ar flow of 1300 standard cubic centimeters per minute (hereinafter referred to as sccm) was established and maintained during the reaction process.

Once a constant inert gas flow was established, the temperature of the substrate with the metal film was ramped up to the reaction temperatures set out in Table 1 below over a period of 5 minutes.

The reaction gas mixture (0.12 molar % H$_2$Se in Ar) was passed through the reactor tube while the substrate was heated to the reaction temperatures set out in Table 1 for the reaction periods also set out in Table 1 so as to form a first film comprising a stable mixture of binary alloys, namely CuSe, InSe and Ga$_2$Se$_3$ and the following ternary alloys, namely CuInSe$_2$ and CuGaSe$_2$. The presence of one or both of the ternary alloys is dependent upon the reaction temperature of step ii and as will be seen below, at 400° C., CuGaSe$_2$ does not form.

Referring to FIG. 2.1 which is an XRD pattern of the first film of step ii prepared under the reaction conditions set out in Table 1 for sample 200250-a, it is clear that there is present a mixture of the three binary alloys and CuInSe$_2$. Under the reaction conditions for sample 200250-a, there is no evidence of the formation of CuGaSe$_2$ at 400° C.

Referring to FIG. 2.2 which is an XRD pattern of the first film of step ii prepared under the reaction conditions set out in Table 1 below for sample 200251-a, reflections [112], [220/204] and [312/116] comprise (a) relatively sharply defined peak positions corresponding to $CuInSe_2$ and (b) shoulders resulting from the presence of $CuGaSe_2$ and the remaining binary alloys of CuSe and $Ga_2Se_3$.

Upon the termination of the reaction periods as set out in Table 1, the samples were subjected to a treatment step in order to further maintain the stability of the resultant stable mixture. This was done by terminating the flow of $H_2Se$ in the reaction tube and by rapidly cooling the samples to temperatures of below 200° C. The samples were kept under the above conditions for 15 minutes to ensure the complete removal of the $H_2Se$ species from the reactor tube.

Both FIGS. 2.1 and 2.2 depict a stable mixture wherein the reaction conditions set out in Table 1 below prevent the reaction going to completion and thus forming fully reacted ternary alloys of $CuInSe_2$ and $CuGaSe_2$ in the absence of CuSe, InSe and $Ga_2Se_3$, as is the case in the prior art.

It is believed by the inventor that starving the system of Se by using extremely low concentrations of Se, and by using low temperatures so as to prevent the completion of the selenization reaction to form fully reacted ternary alloys, stable mixtures such as those represented in FIG. 2.1 or 2.2 can be achieved.

TABLE 1

Reaction conditions (temperature and time) for step ii according to the invention.

| Sample | Reaction conditions ($H_2Se/Ar$) |
| --- | --- |
| 200248-c | 400° C./20 min |
| 200250-a | 400° C./30 min |
| 200263-a | 400° C./40 min |
| 200375-b | 400° C./70 min |
| 200251-a | 450° C./30 min |

Step (iii)

The first film of step (ii) formed under the reaction conditions in Table 1 above was then heated in the reaction tube in a gaseous mixture of $H_2S$ and Ar (the molar percentage of S in the gaseous mixture being maintained close to 0.35% relative to Ar) at a reaction temperature of 450° C. for a period of 5 minutes such that the binary alloys react with S to convert the first film of step ii into a second film comprising a mixture of sulfoselenides, namely Cu(Se,S), In(Se,S) and Ga(Se,S) and the ternary alloys of step (ii).

Figure 3:
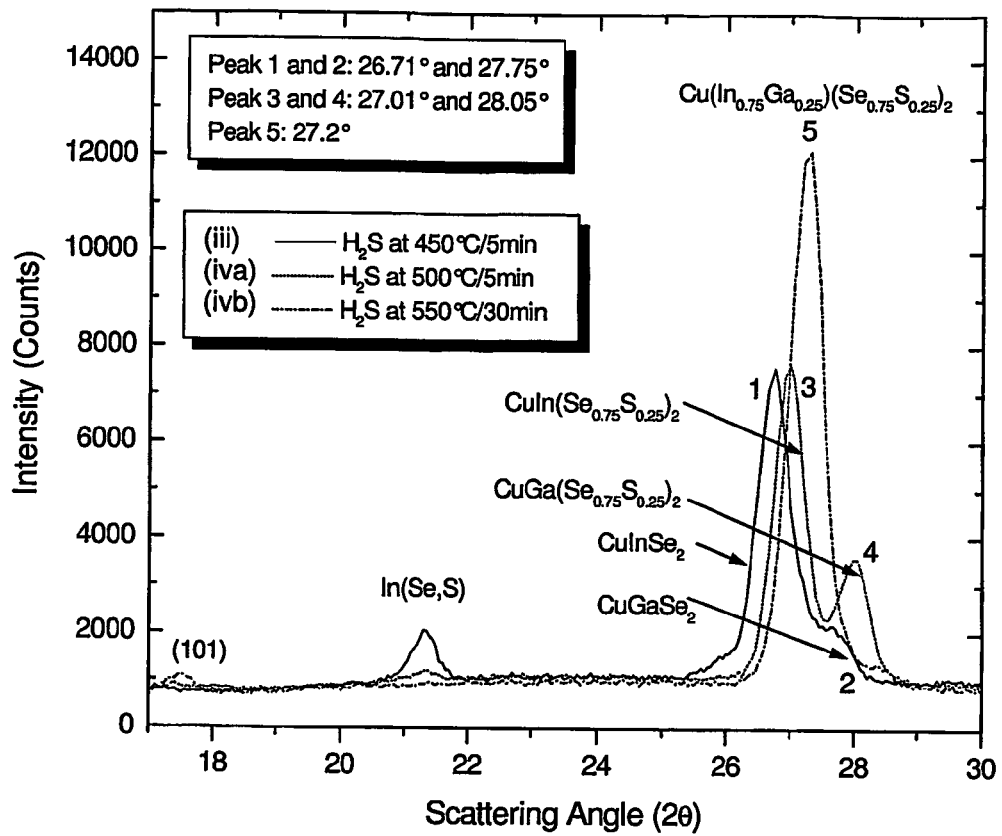

Referring to FIG. 3 which is a XRD pattern of sample 20051-a, and in particular the XRD for step (iii), the presence of In(Se,S) is visible, however the remaining sulfoselenides of Cu(Se,S) and Ga(Se,S) are not shown in the selected 2θ range.

The inventor believes that at temperatures around 450° C., and as depicted in the XRD for step (iii), the reaction between the existing S species in the gaseous atmosphere and the ternary alloys of step (ii) (indicated by peaks 1 at 26.71° and 2 at 27.75° in FIG. 3) is substantially insignificant. In other words, the reaction between S and the ternary alloys is insignificant at this specific temperature.

Step(iv)

The second film of step (iii) was then subjected to the following heat treatment steps in the reaction tube:

(a) heat treating the second film of step (iii) at temperatures of about 500° C. for 5 minutes, such that the sulfoselenides react with the ternary alloys to produce a third film comprising the quaternary alloys of $CuIn(Se_{1-y}S_y)_2$ and $CuGa(Se_{1-y}S_y)_2$ (indicated by peaks 3 at 27.01° and 4 at 28.05° in the XRD for step(iv)(a)).

It is believed by the inventor that in the event that step ii is carried out at 400° C., and in the absence of $CuGaSe_2$, the sulfoselenides may directly react to form $CuGa(Se_{1-y}S_y)_2$ in this step. However, in such a situation, the resulting quaternary alloy will contain a higher S concentration, resulting in a shift of peak 4 to a higher 2θ value than that indicated in FIG. 3.

The reaction of S with the ternary alloys of step (ii) is represented by the absence of the sulfoselenides for example, the absence of the In(Se,S) peak in the XRD pattern for step(iv)(a) in FIG. 3 which is indicative of the fact that it has reacted with $CuInSe_2$ to form $CuIn(Se_{1-y}S_y)_2$.

Comparing the XRD for step (iii) in FIG. 3 with the XRD for step(iv)(a) in FIG. 3, it is clear from the subsequent 2θ shift that the ternary alloys (represented by [112] peaks 1 and 2) have reacted with the sulfoselenides to form a third film comprising the quaternary alloys $CuIn(Se_{1-y}S_y)_2$ and $CuGa(Se_{1-y}S_y)_2$ (represented by [112] peaks 3 and 4).

The degree of shift of the [112] peak from position 1 to 3, and 2 to 4, is determined by the volume fraction of sulfoselenides available to react with the ternary alloys. The volume fraction of sulfoselenides is in turn dependent on the volume fraction of binary alloys present in the first film of step ii, which is controlled by the reaction conditions of step (ii).

Once the stable fully reacted quaternary alloys are formed around 500° C., the reaction process becomes diffusion limited and further reaction to $H_2S/Ar$ at 500° C. for extended periods has insignificant influences on the crystalline state and S content of the composite alloy.

(b) Annealing the third film of step (iv)(a) in the reaction tube at a temperature of 550° C. for a period of 15 minutes so that the quaternary alloys of $CuIn(Se_{1-y}S_y)_2$ and $CuGa(Se_{1-y}S_y)_2$ react so as to form a pentenary $Cu(In_{1-x}Ga_x)(Se_{1-y}S_y)_2$ alloy semiconductor film (wherein x may vary between 0.1 and 0.5, preferably between 0.25 and 0.3 and y may be between 0 and 1, preferably between 0.05 and 0.5.). The transition from the quaternary to pentenary alloy state (indicated by peak 5 at 27.2° in the XRD for step(iv)(b) in FIG. 3) occurs within 10 to 15 minutes of the reaction with $H_2S$, while an additional 15 minutes of annealing is typically required to optimize the structural properties of the pentenary alloy.

It is important to note that the sulfur content in the pentenary alloy of $Cu(In_{1-x}Ga_x)(Se_{1-y}S_y)_2$ is dependent on the sulfur content of the quaternary alloys $CuIn(Se_{1-y}S_y)_2$ and $CuGa(Se_{1-y}S_y)_2$, and, the values of x and y are dependent upon the volume fraction of sulfoselenides. In fact this relationship may be expressed mathematically, as shown in FIG. 1, such that the sulfur content (i.e. value of z in FIG. 1) in the final pentenary alloy is determined by the concentration of sulfur in the respective quaternary alloys (i.e. values of x and y in FIG. 1). Mathematically this dependence can be expressed as $z=x+y/2$. The value of z ultimately determines the 2θ-values of the [112] diffraction peaks of the pentenary alloys and accordingly the lattice parameters and band gap of the alloy.

For the purposes of the experiment, both steps (iii) and(iv) were carried out consecutively in a reactive gas mixture of $H_2S$, wherein the temperature is ramped up from 450° C. to 550° C.

Upon the completion of both steps (iii) and(iv), the reaction tube was evacuated to a pressure of $2.67 \times 10^{-4}$ Pa for at least two hours to ensure the complete removal of toxic gases from the reactor tube. The tube was then pressurized and the samples were removed.

The inventor believes that by carrying out the method as set out above, a substantially homogeneous pentenary alloy semiconductor film is formed having improved characteristics when compared to semiconductor films formed by prior art methods.

Discussion of the Characteristics of $Cu(In_{1-x}Ga_x)Se_{1-y}S_y)_2$ Alloy Semiconductor Films Prepared According to the Method of the Invention.

The samples set out in Table 1 above were subjected to steps (iii) and(iv) to form substantially homogeneous semiconductor pentenary alloys and their corresponding chemical compositions as determined by energy dispersive x-ray spectroscopy (EDS) with reference to Cu/(In +Ga), Ga/(Ga+In), and S/(Se+S) atomic ratios are set out in Table 2 below. Also shown in Table 2 below are the band gap values for each of the samples as well as the position of the [112] diffraction peaks.

A comparison of sample 200250-a and 200251-a, indicates how an increase in the reaction temperature of step ii from 400° C. to 450° C. led to a substantial decrease in the sulfur incorporation and hence a shift in the [112] diffraction peak to a lower angle.

In the case of the last two samples, (i.e. 200251-a and 200252-a) the reaction conditions of step ii were maintained constant, while the reaction periods for annealing the resultant composite alloy in step(iv)(b) above was increased from 30 to 90 minutes.

Comparison of these samples clearly indicates that annealing in the presence of an $H_2S/Ar$ atmosphere for extended periods above 30 minutes had marginal influences on the degree of sulfur incorporation.

Accordingly this indicates that the substantially homogeneous pentenary alloy formed after only 30 minutes of annealing in $H_2S/Ar$ at 550° C. It further implies that once fully reacted homogeneous pentenary alloys are produced, the reaction process becomes diffusion limited and further incorporation of sulfur needs to occur via the replacement of selenium species.

FIGS. 4.1 and 4.2 are glancing-incidence x-ray diffraction (GIXRD) patterns of the [112] reflections of samples 200251a and 200250a set out in Table 2 above. In this characterization method, decreasing amounts of the incident

TABLE 2

Summary of reaction conditions[†] and their influence on the degree of sulfur incorporation and the resulting band gap values of the respective samples.

| Sample | Step ii reaction conditions $H_2Se/Ar$ | Step(iv) reaction conditions $H_2Se/Ar$ | Cu/In + Ga | Ga/Ga + In | S/Se + S | $2\theta_{(112)}$ | $E_G$ (eV) |
|---|---|---|---|---|---|---|---|
| 2003078-a | 400° C./ 10 min | 550° C./ 30 min | 0.90 | 0.25 | 0.70 | 27.80 | 1.40 |
| 200248-c | 400° C./ 20 min | 550° C./ 30 min | 0.90 | 0.25 | 0.56 | 27.65 | 1.39 |
| 200250-a | 400° C./ 30 min | 550° C./ 30 min | 0.91 | 0.25 | 0.40 | 27.40 | 1.32 |
| 200263-a | 400° C./ 40 min | 550° C./ 30 min | 0.90 | 0.25 | 0.35 | 27.30 | 1.23 |
| 200375-b | 400° C./ 70 min | 550° C./ 30 min | 0.93 | 0.25 | 0.15 | 27.0 | 1.15 |
| 200376-c | 400° C./ 80 min | 550° C./ 30 min | 0.90 | 0.25 | 0.05 | 26.90 | 1.13 |
| 200251-a | 450° C./ 30 min | 550° C./ 30 min | 0.92 | 0.25 | 0.25 | 27.20 | 1.20 |
| 200252-a | 450° C./ 30 min | 550° C./ 90 min[‡] | 0.91 | 0.23 | 0.25 | 27.21 | 1.21 |

[†]These studies were conducted in a constant flow of 0.12% $H_2Se$ diluted in Ar and 0.35% $H_2S$ diluted in Ar. The 2θ-positions of the [112] peaks of the pentenary alloys were measured by GIXRD with a Cu tube at 40 kV. The corresponding band gap values were calculated from quantum efficiency measurements.
[‡]The time period for step vi(b) was increased to 90 minutes.

A comparison of the first four samples in Table 2 clearly indicates the influence of the conditions of step ii of the invention on the degree of sulfur incorporation which is exemplified by the S/(S+Se) column of the table. Accordingly, changing the conditions of step ii modified the subsequent reaction kinetics during step (iii) of the invention resulting in a change in the sulfur incorporation in the final $Cu(In_{0.75}Ga_{0.25})(Se_{1-y}S_y)_2$ semiconductor film.

angle result in a decreasing penetration depth of the x-ray beam. It is important to note that scattering angles between 0.2° and 10° revealed virtually no shift in the lattice parameters between the surface and bulk of the samples, which confirms the homogeneity of the pentenary alloys. Of equal significance is that the variation in the conditions of step ii resulted in a significant shift in the 2θ-position of the [112] diffraction peaks. Since the gallium content is virtually constant in all composite alloys, this relative shift is attributed to the varying degrees of sulfur incorporation. Table 3 below shows the various shifts in the 2 angles and table 4 shows the corresponding shifts in the d-spacings for some of the pentenary alloys of Table 2.

TABLE 3

Summary of the positions of the [112] reflections at different angles of incidence. The overall peak shifts are calculated as the difference between the peak position of the [112] reflection at 0.5° (near-surface) and 10° (bulk) of the samples.

| Sample # | S/Se + S | $2\theta_{(112)}$ (0.5°) | $2\theta_{(112)}$ (1°) | $2\theta_{(112)}$ (2°) | $2\theta_{(112)}$ (5°) | $2\theta_{(112)}$ (10°) | Overall Shift (°) |
|---|---|---|---|---|---|---|---|
| 200250-a | 0.40 | 27.402 | 27.399 | 27.399 | 27.400 | 27.399 | 0.003 |
| 200263-a | 0.35 | 27.300 | 27.299 | 27.298 | 27.300 | 27.296 | 0.004 |
| 200375-b | 0.15 | 27.055 | 27.050 | 27.049 | 26.998 | 27.050 | 0.005 |
| 200251-a | 0.25 | 27.201 | 27.203 | 27.202 | 27.201 | 27.199 | 0.002 |
| 200252-a | 0.25 | 27.205 | 27.250 | 27.249 | 27.247 | 27.198 | 0.007 |

TABLE 4

Summary of the positions of the d-spacings (in angström) of the [112] reflections at different angles of incidence. The overall shifts in d-spacings are calculated as the difference between the d-spacing measured at 0.5° (near-surface) and 10° (bulk) of the samples.

| Sample # | S/Se + S | $d_{(112)}$ (0.5°) | $d_{(112)}$ (1°) | $d_{(112)}$ (2°) | $d_{(112)}$ (5°) | $d_{(112)}$ (10°) | Overall Shift (Å) |
|---|---|---|---|---|---|---|---|
| 200250-a | 0.40 | 3.2521 | 3.2525 | 3.2525 | 3.2524 | 3.2525 | 0.0004 |
| 200263-a | 0.35 | 3.2640 | 3.2642 | 3.2643 | 3.2640 | 3.2645 | 0.0005 |
| 200375-b | 0.15 | 3.2931 | 3.2936 | 3.2937 | 3.2999 | 3.2936 | 0.0005 |
| 200251-a | 0.25 | 3.2757 | 3.2755 | 3.2755 | 3.2757 | 3.2759 | 0.0002 |
| 200252-a | 0.25 | 3.2753 | 3.2700 | 3.2701 | 3.2703 | 3.2760 | 0.0007 |

The overall shift in the d-spacings shows that the sample alloy semiconductor films prepared by the method according to the invention are characterised by a crystal structure comprising a lattice of unit cells, wherein all crystallographic planes show a variance in d-spacing of less than 0.001

Figure 5:
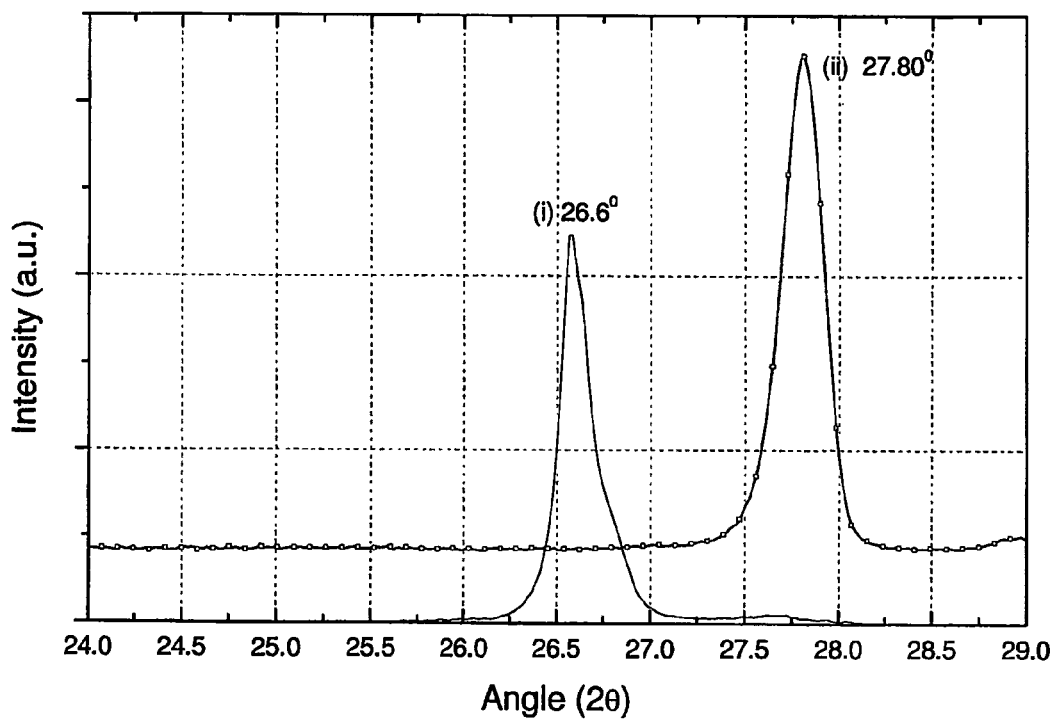
FIG. 5 is an XRD pattern of sample 2003078-a of Example 1.

FIG. 5 depicts the positions of the [112] diffraction peaks of a $CuIn_{0.75}Ga_{0.3}$ precursor, which was (i) first selenized and subsequently (ii) sulfurized under the conditions of step (iv) in Table 2 for sample 2003078-a. The experimental conditions during selenization/sulfurization were manipulated in order to produce a pentenary alloy (sample 2003078-a) with a high S content (i.e. S/Se+S=0.7). Peak (i) at 26.60° is the expected [112] peak position of $CuInSe_2$ after selenization. The asymmetric behaviour of the peak at this stage of processing is attributed to Ga grading.

It important to note, however, that the [112] peak position shifted to an angle of 27.8° after sulfurization. Using Vegard's law and assuming a Ga concentration of around 25%, this corresponds to a S content of around 70%, hence a homogeneous $Cu(In_{0.7}Ga_{0.3})(Se_{0.3}S_{0.7})_2$ alloy. These compositions were confirmed by EDS measurements. It is especially important to note that peak (ii) is symmetric with no evidence of compositional broadening. The band gap of sample 2003078-a, determined from QE measurements, is 1.4 eV (see FIG. 7). Although this band gap may be too high for optimum conversion efficiencies, it is clear from the above that homogeneous material can be produced even for high S containing films.

Figure 8:
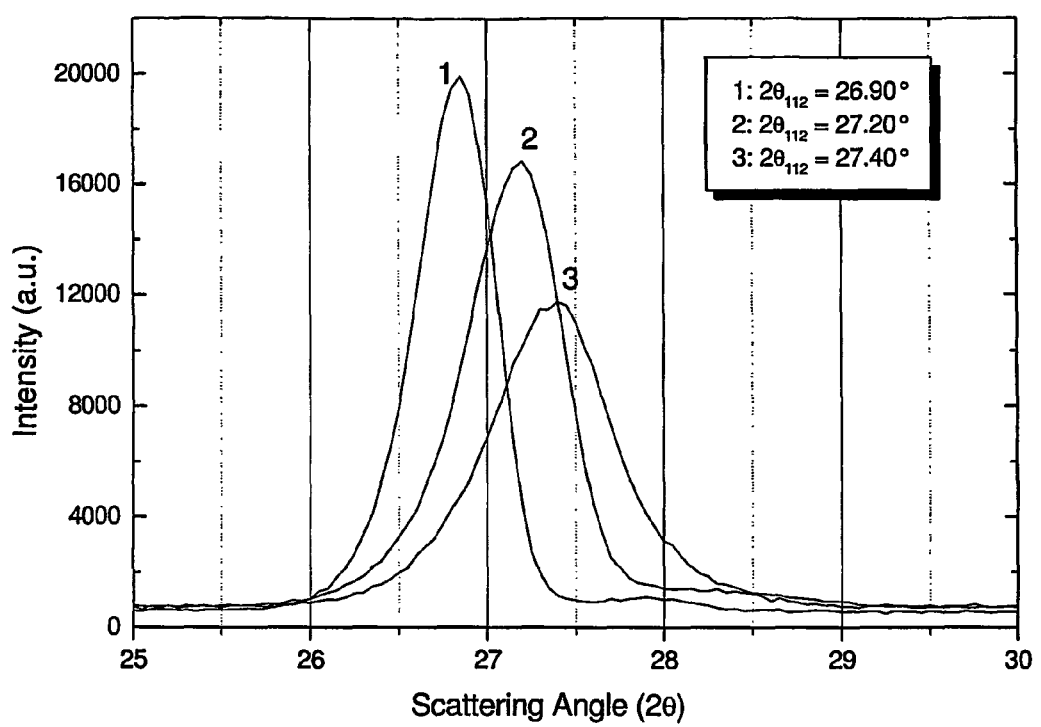
FIG. 8 are XRD patterns of a $Cu(In_{0.75}Ga_{0.25})(Se_{0.95}S_{0.05})_2$ alloy semiconductor film (sample 200376-c); a $Cu(In_{0.75}Ga_{0.25})(Se_{0.75}S_{0.25})_2$ alloy semiconductor film (sample 200251-a) and a $Cu(In_{0.75}Ga_{0.25})(Se_{0.6}S_{0.4})_2$ alloy semiconductor film (sample 200250-a) of Example 1.

FIG. 8 depicts the [112] peak positions of various homogeneous $Cu(In,Ga)(Se,S)_2$ alloys prepared in terms of the above method, more particularly the [112] peak positions for sample 2003076-c, sample 200251-a and sample 200250-a. Once again it is assumed that the Ga concentration in precursors remains constant and the selenization/sulfurization reaction conditions were manipulated, as shown in Table 2, to control the degree of S incorporation, and hence the lattice parameters.

It can be seen from FIG. 8 that the position of the [112] peak varies between 26.9° to 27.4°, which corresponds to S/Se+S atomic ratios between 0.05 and 0.4, as indicated in Table 2 for the samples 2003076-c, sample 200251-a and sample 200250-a. The latter values are again estimated from Vegard's law, assuming a homogeneous pentenary alloy and a Ga/Ga+In ratio of 0.25. The corresponding shift in band gap value is between 1.1 eV and 1.3 eV for these specific alloys.

Figure 9:
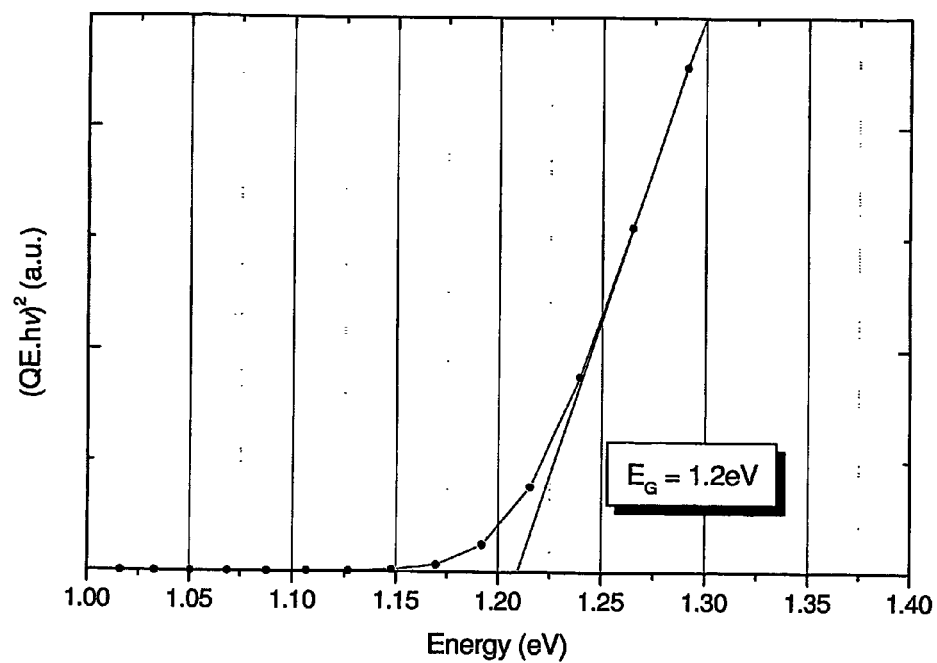
FIG. 9 is a quantum efficiency (QE) graph of a homogeneous $Cu(In_{0.75}Ga_{0.25})(Se_{0.75}S_{0.25})_2$ (sample 200251-a) alloy semiconductor film of Example 1.

FIG. 9 shows, for example, the typical QE curve for a homogeneous $Cu(In_{0.75}Ga_{0.25})(Se_{0.75}S_{0.25})_2$ alloy, sample 200251-a, with a [112] peak position close to 27.2°. FIG. 10 shows a plot of the band gap values as a function of S/Se+S ratio.

Figure 7:
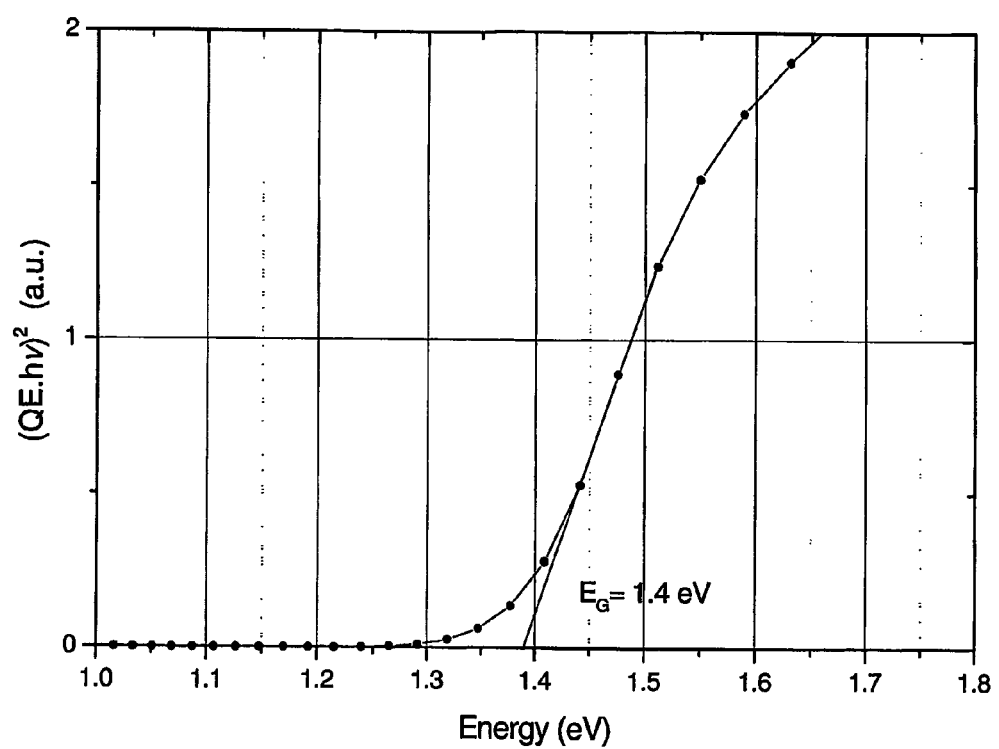
FIG. 7 is a quantum efficiency (QE) graph for sample 200290-a of Example 1.

FIGS. 11, 12 and 13 depict the typical surface morphologies of $Cu(In,Ga)(Se,S)_2$ alloy semiconductor thin films prepared in terms of example 1, with varying S content and hence band gap. In the case of FIG. 11 (sample 200251-a), the position of the [112] peak is at 27.2° and the corresponding band gap is at 1.20 eV (see FIG. 9). The [112] peak position of the alloy in FIG. 12 (sample 200250-a) is at 27.4°. FIG. 13 depicts the structural features of the alloys with a [112] peak position close to 27.8° (sample 2003078-a) with corresponding band gap value at 1.4 eV, as shown in FIG. 7.

It can be seen from FIGS. 11, 12 and 13 that the resultant alloys have relatively uniform surface morphologies with typical grain size being of about 1 m.

FIG. 14 is a concentration depth profile of the elements Cu, In, Ga, Se and S for sample 200251-a. The substantially homogeneous nature of the sample is shown in the profile, wherein the concentration of the elements through the alloy are substantially constant up until the Mo metal layer.

Determination of the Open-Circuit Voltages for Various Solar Cell Devices Comprising Substantially Homogeneous Pentenary Alloy Semiconductor Films Prepared in Terms of the Method According to the Invention.

Solar cells devices were fabricated according to a standard cell fabrication procedure, which included a 50 nm CdS buffer layer and a 50 nm intrinsic ZnO/150 nm indium tin oxide (ITO) window layer. The glass/Mo/Cu(In,Ga)(Se,S)$_2$/CdS/ZnO cell structures were evaluated under simulated A.M. 1.5 conditions at 25° C. The band gap values of the substantially homogeneous pentenary alloys were varied by modifying the reaction conditions of step ii, as indicated in Table 2. The corresponding cell parameters are set out in Table 5 below.

TABLE 5

Summary of the cell parameters of various photovoltaic devices in which the semiconductor films are substantially homogeneous pentenary alloy semiconductor films with different band gap values.

| Samples | Ga/Ga + In | S/Se + S | $E_G$ eV | $V_{oc}$ mV | $J_{sc}$ mA/cm$^2$ | FF % | η % |
|---|---|---|---|---|---|---|---|
| 200248-c | 0.25 | 0.56 | 1.39 | 677.9 | 23.55 | 53.3 | 8.5 |
| 200250-a | 0.25 | 0.45 | 1.32 | 685.9 | 27.17 | 59.8 | 11.2 |
| 200252-a | 0.23 | 0.25 | 1.21 | 630.2 | 29.46 | 64.1 | 11.9 |
| 200251-a | 0.24 | 0.23 | 1.20 | 610.4 | 32.86 | 67.5 | 13.5 |
| 200375-b | 0.25 | 0.15 | 1.15 | 638.8 | 31.82 | 74.8 | 15.2 |

Figure 6:
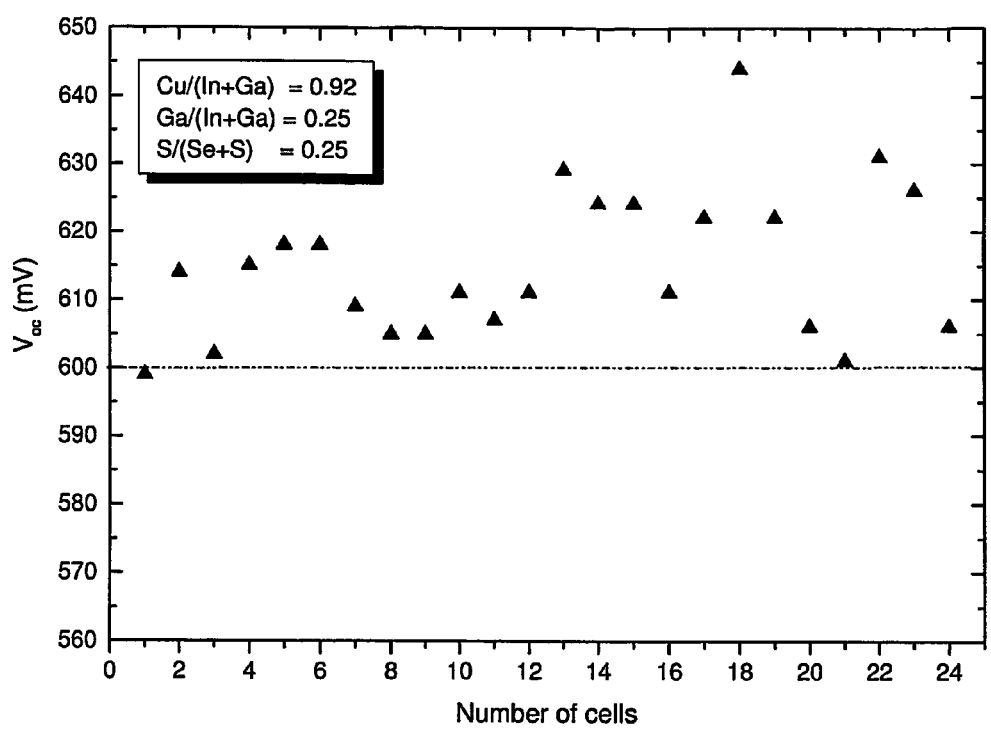
FIG. 6 is a plot of open-circuit voltage ($V_{oc}$) for a number of photovoltaic cells having semiconductor films of sample 200251-a.

The conversion efficiencies were critically related to the band gap of the sample alloys and varied between 8% and 15%, the best device being that with the lowest band gap (sample 200375-b). All devices had open-circuit voltages ($V_{oc}$) beyond 600 mV. Also, 24 photovoltaic cells were made including pentenary alloy semiconductor films prepared under the reaction conditions set out above for sample 200251-a. The $V_{oc}$ values of these cells were confined to values in the range of 600 to 640 mV (see FIG. 6) and it is believed by the inventor that this is evidence of the reproducibility of the method according to the invention.

EXAMPLE 2

Experimental Procedure for the Production of a Group IB-IIIA-VIA Quaternary Alloy Step (i)

Step i is the same as set out under the general experimental procedure. More particularly, the deposition of the Mo layer was followed, without breaking vacuum, by the co-sputtering of Cu$_{0.75}$Ga$_{0.25}$ and In at a working pressure of 0.3 Pa. The co-sputtering was also carried out without intentional substrate heating and the substrate was rotated during co-sputtering in order to enhance the mixing of the Cu—Ga—In alloy. The total thickness of the Cu—In—Ga alloys was 0.6 μm and the Cu/(In+Ga)- and Ga/(Ga+In)-atomic ratios were maintained at 0.9 and 0.25 respectively.

Step ii

In this case the same method as set out in step ii of experiment 1 above was followed, however the reaction temperature was kept at 400° C. so as to form a first film comprising a stable mixture of binary alloys and CuInSe$_2$ only.

It is believed by the inventor that in the case of the production of quaternary alloy semiconductor films it is necessary to prevent the formation of the second ternary alloy, namely CuGaSe$_2$ so as to obtain a homogeneous quaternary alloy. This was achieved by keeping the reaction temperature at 400° C.

As above, the first film of step ii is subjected to a treatment step to maintain the stability of the mixture, wherein the H$_2$Se flow is terminated and the first film is cooled to temperatures below 100° C. The Ar flow in this case was maintained for a period of at least 15 minutes, once again to ensure the complete removal of the H$_2$Se species.

Step (iii)

In the case of the production of a quaternary alloy semiconductor film, this step is not carried out.

Step(iv)

The first film is subjected to the following consecutive steps:
(a) heating the first film of step (ii) in the reaction tube in an inert atmosphere of Ar to a reaction temperature of 500° C. for 5 minutes;
(b) annealing the first film of step (ii) in the reaction tube in an Ar containing atmosphere at 500° C. for at least 15 minutes;
(c) annealing the first film in the presence of 0.12 molar percent of H$_2$Se in Ar for 30 minutes at 550° C. so as to form a homogeneous quaternary Cu(In$_{1-x}$Ga$_x$)Se$_2$ alloy semiconductor film, wherein x is from 0.25 to 0.3.

As in the case of the formation of a pentenary alloy, the reaction tube was evacuated to a pressure of 2.67×10$^{-4}$ Pa for at least two hours to ensure the complete removal of toxic gases from the reactor tube. The tube was then pressurized and the samples were removed.

Once again, the inventor believes that by following the reaction conditions and method set out under example 2, substantially homogeneous Cu(In$_{1-x}$Ga$_x$)Se$_2$ semiconductor films can be formed.

Three samples were prepared under the conditions set out under experiment 2, the reaction conditions and the their corresponding chemical compositions as determined by energy dispersive x-ray spectroscopy (EDS) with reference to Cu/(In+Ga) and Ga/(Ga+In) atomic ratios are set out in Table 6 below.

TABLE 6

Summary of reaction conditions[†] and the resulting band gap values of the respective samples.

| Sample | Step ii reaction conditions H$_2$Se/Ar | Step(iv) reaction conditions H$_2$Se/Ar | Cu/In + Ga | Ga/Ga + In | 2θ$_{(112)}$ | $E_G$ (eV) |
|---|---|---|---|---|---|---|
| 200284-a | 400° C./ 30 min | 500° C./ 30 min | 0.90 | 0.25 | 26.80 | 1.10 |
| 200259-a | 400° C./ 15 min | 500° C./ 30 min | 0.90 | 0.25 | 26.85 | 1.12 |
| 200249-a | 400° C./ 15 min | 500° C./ 30 min | 0.90 | 0.30 | 26.90 | 1.13 |

[†]These studies were conducted in a constant flow of 0.12% H$_2$Se diluted in Ar for step (ii) and 0.12% H$_2$Se diluted in Ar for step (iv)(c). The 2θ-positions of the [112] peaks of the pentenary alloys were measured by GIXRD with a Cu tube at 40 kV. The corresponding band gap values were calculated from quantum efficiency measurements.

Below, in Table 7, the overall 2θ shift for the above samples is shown, and in Table 8, the overall shift in the corresponding d-spacings is also shown.

TABLE 7

Summary of the positions of the [112] reflections at different angles of incidence. The overall peak shifts are calculated as the difference between the peak position of the [112] reflection at 0.5° (near-surface) and 10° (bulk) of the samples.

| Sample # | Ga/Ga + In | $2\theta_{(112)}$ (0.5°) | $2\theta_{(112)}$ (1°) | $2\theta_{(112)}$ (2°) | $2\theta_{(112)}$ (5°) | $2\theta_{(112)}$ (10°) | Overall Shift (°) |
|---|---|---|---|---|---|---|---|
| 200284-a | 0.25 | 26.804 | 26.900 | 26.897 | 26.898 | 26.852 | 0.048 |
| 200259-a | 0.25 | 26.848 | 26.849 | 26.850 | 26.851 | 26.895 | 0.045 |
| 200349-a | 0.30 | 26.950 | 26.949 | 26.903 | 26.901 | 26.948 | 0.002 |

TABLE 8

Summary of the positions of the d-spacings (in angström) of the [112] reflections at different angles of incidence. The overall shifts in d-spacings are calculated as the difference between the d-spacing measured at 0.5° (near-surface) and 10° (bulk) of the samples.

| Sample # | Ga/Ga + In | $d_{(112)}$ (0.5°) | $d_{(112)}$ (1°) | $d_{(112)}$ (2°) | $d_{(112)}$ (5°) | $d_{(112)}$ (10°) | Overall Shift (Å) |
|---|---|---|---|---|---|---|---|
| 200284-a | 0.25 | 3.3233 | 3.3117 | 3.3120 | 3.3119 | 3.3175 | 0.0058 |
| 200259-a | 0.25 | 3.3180 | 3.3178 | 3.3177 | 3.3176 | 3.3122 | 0.0058 |
| 200349-a | 0.30 | 3.3056 | 3.3057 | 3.3113 | 3.3116 | 3.3059 | 0.0003 |

The overall shift in the d-spacings shows that the sample alloy semiconductor films prepared by the method according to the invention are characterised by a crystal structure comprising a lattice of unit cells, wherein all crystallographic planes show a variance in d-spacing of less than 0.06.

To further exemplify the homogeneous characteristics of quaternary alloys prepared by the method according to the invention, a prior art sample was prepared and its characteristics were compared to a sample prepared in terms of the method set out in example 2.

FIGS. 15.1 and 15.2 represent XRD patterns, depicting the crystalline features of a typical graded quaternary alloy (prior art sample) and a homogeneous quaternary alloy (namely sample 200259-a) respectively, the alloys being prepared in the manner set out below. In both cases, measurements were taken with Cu $K_\alpha$ radiation at 40 kV.

In the case of the graded quaternary alloy (prior art sample) (see XRD pattern in FIG. 15.1), the alloy was rapidly heated in less than 5 minutes to 500° C. in the presence of H$_2$Se, followed by an annealing step in 5 molar percent H$_2$Se in Ar for 60 minutes at 500° C. This procedure resulted in a significant degree of interdiffusion between the In-rich and Ga-rich phases and XRD analysis indicated the presence of a graded Cu(In$_x$Ga$_{1-x}$)Se structure. This phenomenon is represented by the asymmetric broadening of the [112], [220/204] and [312/116] diffraction peaks. In this regard it is important to note that the position of the [112] diffraction peak at 26.65° still represents the lattice parameters of the pure CuInSe$_2$ phase, while the shoulder is due to increasing amounts of Ga which extend all the way to the peak position of CuGaSe$_2$. It is therefore reasonable to assume that the surface of the absorber film contains pure CuInSe$_2$ and that the gallium increases gradually towards the Mo back contact.

The second sample, i.e. sample 200259-a, was prepared under the described experimental conditions set out in steps i, ii and(iv) under example 2, Table 6. In order to control the reaction velocities of the binary alloys, step ii was carried out at 400° C., using extremely low gas concentrations of 0.12 molar % H$_2$Se in Ar. The reaction period was fixed at 30 minutes. After complete removal of Se species from the reaction zone, the first film was annealed in the presence of Ar for 15 minutes at a temperature of 500° C., followed immediately by an annealing step in 0.12 molar percent H$_2$Se in Ar for 30 minutes.

XRD studies of sample 200259-a, which is represented by FIG. 15.2, revealed that the resultant film was homogeneous with no evidence of segregated material. The sharp, well-defined [112], [220/204] and [312/116] peaks are indicative of high crystalline quality. It is also important to note that the [112] peak position increased from about 26.65°, which is typical for pure CuInSe$_2$ (as shown in FIG. 15.1), to a 2θ value of 26.85°. The latter shift of the [112] peak towards a larger 2θ value is in accordance with a decrease in the lattice parameter associated with an increase in Ga content in the quaternary system. This degree of shift of the diffraction peaks towards higher 2θ values is exactly in accordance with Vegard's law, assuming homogeneous material and a Ga/(Ga+In) atomic ratio close to 0.25.

FIG. 16 depicts GIXRD patterns of the [112] peak of sample 200259-a at incident angles between 0.5° and 10°. Once again is should be realized that a decrease in the incident angle results in a decrease in penetration depth of the x-ray beam. It is important to note from FIG. 16 that scattering angles between 0.5° and 10° revealed virtually no shift in the lattice parameters between the surface and bulk material, which confirms that the film is uniform rather than compositionally graded.

The in-depth compositional features of the quaternary alloys were studied by x-ray fluorescence (XRF). In this characterization method, the samples were repeatedly etched in bromine methanol, followed by XRF K$_{\alpha 1,2}$ line intensity measurements of the remaining material after each etching step. From these analyses the chemical compositions of the prior art sample and sample 200259-a could be estimated through almost the entire film thickness.

FIG. 17.1 represents the in-depth compositional uniformity of the compositionally graded prior art $Cu(In_{0.75}Ga_{0.25})Se_2$ alloy film of FIG. 15.1. It is important to note from FIG. 17.1 that the Cu and Se element concentrations remained virtually constant through the entire thickness of the film. Even more significant, it can be seen that the remaining material after the successive etching steps became increasingly gallium-rich, while an opposite trend was observed for indium. The resulting Ga/(Ga+In) atomic ratio increased from a value of 0.28 for the sample before etching to 0.75 after the last etching step. This continuous increase in the Ga/(Ga+In) atomic ratio with sample depth is consistent with the graded $Cu(In_xGa_{1-x})Se_2$ phase observed by the XRD studies in FIG. 15.1.

FIG. 17.2 represents the in-depth compositional properties of sample 200259-a. It can be seen that the Cu, In, Ga and Se concentration remained virtually constant through the entire layer thickness of these specific quaternary alloys. These results are therefore in line with the XRD data presented in FIG. 15.2, confirming that this growth process eliminated the grading of gallium and indium in the $Cu(In_xGa_{1-x})Se_2$ phase and resulted in a homogeneous quaternary alloy.

The homogeneity of sample 200259-a is demonstrated by the concentration profile of FIG. 18, wherein the concentration of the elements Cu, In, Ga and Se is substantially constant through the sample alloy.

EXAMPLE 3

Experimental Procedure for the Production of a Group IB-IIIA-VIA Quaternary Alloy—Production of $CuIn(Se_{1-y}S_y)_2$ Step i In this case, a metal film was prepared comprising only Cu and In, as opposed to the previous cases wherein Ga was also included. More specifically the metal precursors of Cu and In were co-sputtered onto a substrate using a Leybold Z650 DC Magnetron Sputtering System. The system accommodates three separate targets (i.e. Mo, Cu and In), and the substrate was rotated continuously during deposition in order to promote intermixing of Cu and In. The Mo back contact (about 1 µm thick) was sputtered from a 5N purity Mo target at a working pressures between 0.3 Pa to 0.7 Pa. The Mo film was cooled in vacuum to room temperature, followed by the co-sputtering of the Cu and In layers from 5N purity Cu and In targets. The total thickness of the copper-indium alloy was around 0.6 µm, and the desired Cu/In atomic ratio between 0.85-0.9 was achieved by keeping the Cu power constant at 0.72 W·cm$^{-2}$, while varying the In power between 1.0 and 1.4 W·cm$^{-2}$ during respective deposition processes. All the Cu—In layers were deposited at a working pressure of 0.5 Pa.

Step ii

In this case a similar method as set out under example 2 was used. The metal film comprising the Cu and In precursors was placed in the reactor tube, which was evacuated to a pressure of 1×10$^{-4}$ Pa in order to remove all traces of any atmospheric residue. The reaction gas mixture (c.a. 0.12% $H_2Se$ in Ar) was passed through the reaction tube while the substrate was heated for temperatures between 350° C. to 450° C. for periods of between 10 and 60 minutes so as to form a film comprising a stable mixture of InSe, CuSe and $CuInSe_2$.

Immediately after the selenization of the metal film, the first film was rapidly cooled and the flow of the gas mixture was terminated so as to maintain the stable mixture.

Step (iii)

In the case of the production of a quaternary alloy semiconductor film, this step is not carried out.

Step(iv)

The heat treatment of step (iv) comprised first heat treating the first film of step (ii) to the desired reaction temperatures of from 500 to 550° C. within at least 30 minutes.

The first film of step (ii) is then subsequently annealed in the presence of a gaseous mixture of $H_2S$ in Ar (0.35% molar % $H_2S$ in Ar) for a period of 30 minutes at a temperature of around 550° C.

During the above step, the existing binary alloys of CuSe and InSe react with S to form the sulfoselenides of Cu(Se,S) and In(Se,S), which sulfoselenides in turn react with the ternary alloy of $CuInSe_2$ to form a $CuIn(Se_{1-y}S_y)_2$ alloy semiconductor film.

As in the case of the formation of a pentenary alloy, the reaction tube was evacuated to a pressure of $2.67\times10^{-4}$ Pa for at least two hours to ensure the complete removal of toxic gases from the reactor tube. The tube was then pressurized and the samples were removed.

Again, the inventor believes that by following the reaction conditions and method set out under example 3, substantially homogeneous $CuIn(Se_{1-y}S_y)_2$ semiconductor films can be formed.

Three samples were prepared under the conditions set out under experiment 3, the reaction conditions and the their corresponding chemical compositions as determined by energy dispersive x-ray spectroscopy (EDS) with reference to Cu/In and S/(Se+S) atomic ratios are set out in Table 9 below.

TABLE 9

Summary of reaction conditions[†] and the resulting band gap values of the respective samples.

| Sample | Step ii reaction conditions $H_2Se/Ar$ | Step(iv) reaction conditions $H_2S/Ar$ | Cu/In | S/Se + S | $2\theta_{(112)}$ | $E_G$ (eV) |
|---|---|---|---|---|---|---|
| 200258-b | 400° C./ 30 min | 500° C./ 30 min | 0.90 | 0.10 | 26.80 | 1.10 |
| 200259-c | 400° C./ 15 min | 500° C./ 30 min | 0.90 | 0.30 | 27.00 | 1.15 |
| 200263-b | 400° C./ 10 min | 500° C./ 30 min | 0.90 | 0.50 | 27.30 | 1.23 |

[554]These studies were conducted in a constant flow of 0.12% $H_2Se$ diluted in Ar for step (ii) and 0.35% $H_2S$ diluted in Ar for step (iv). The 2θ-positions of the [112] peaks of the pentenary alloys were measured by GIXRD with a Cu tube at 40 kV. The corresponding band gap values were calculated from quantum efficiency measurements.

Below, in Table 10, the overall 2θ shift for the above samples is shown, and in Table 11, the overall shift in the corresponding d-spacings is also shown.

TABLE 10

Summary of the positions of the [112] reflections at different angles of incidence. The overall peak shifts are calculated as the difference between the peak position of the [112] reflection at 0.5° (near-surface) and 10° (bulk) of the samples.

| Sample # | S/Se + S | 2θ$_{(112)}$ (0.5°) | 2θ$_{(112)}$ (1°) | 2θ$_{(112)}$ (2°) | 2θ$_{(112)}$ (5°) | 2θ$_{(112)}$ (10°) | Overall Shift (°) |
|---|---|---|---|---|---|---|---|
| 200258-b | 0.10 | 26.799 | 26.802 | 26.849 | 26.849 | 26.801 | 0.002 |
| 200259-c | 0.30 | 27.005 | 26.998 | 26.997 | 26.951 | 26.950 | 0.055 |
| 200263-b | 0.50 | 27.300 | 27.302 | 27.299 | 27.298 | 27.346 | 0.046 |

TABLE 11

Summary of the positions of the d-spacings (in angström) of the [112] reflections at different angles of incidence. The overall shifts in d-spacings are calculated as the difference between the d-spacing measured at 0.5° (near-surface) and 10° (bulk) of the samples.

| Sample # | S/Se + S | d$_{(112)}$ (0.5°) | d$_{(112)}$ (1°) | d$_{(112)}$ (2°) | d$_{(112)}$ (5°) | d$_{(112)}$ (10°) | Overall Shift (Å) |
|---|---|---|---|---|---|---|---|
| 200258-a | 0.20 | 3.3239 | 3.3236 | 3.3178 | 3.3178 | 3.3237 | 0.0002 |
| 200259-c | 0.30 | 3.2990 | 3.2998 | 3.3000 | 3.3055 | 3.3056 | 0.0066 |
| 200263-b | 0.50 | 3.2640 | 3.2638 | 3.2842 | 3.2643 | 3.2587 | 0.0053 |

The overall shift in the d-spacings shows that the sample alloy semiconductor films prepared by the method according to the invention are characterised by a crystal structure comprising a lattice of unit cells, wherein all crystallographic planes show a variance in d-spacing of less than 0.007.

To further exemplify the homogeneous characteristics of quaternary alloys prepared by the method according to the invention, a prior art sample was prepared and its characteristics were compared to a sample prepared in terms of the method set out under example 3, more particularly sample 200259-c.

A first sample was prepared under the prior art conditions wherein a metal film comprising Cu and In was selenised at 450° C. for 60 minutes to produce a fully reacted CuInSe$_2$ film. The sample was then subsequently sulfurized at 550° C. for 30 minutes.

FIG. 19 depicts a XRD pattern of sample 200259-c. It is important to note that the prior art reaction process resulted in the formation of two discrete ternary phases, namely CuInSe$_2$ and CuInS$_2$. The position of the [112] diffraction peak at 26.68° represents the lattice parameter of CuInSe$_2$, while the peak position at 27.84° represents the lattice parameters of CuInS$_2$. The presence of the weak reflection close to 27° represents the formation of the quaternary CuIn(Se,S)$_2$ phase. This anomalous growth bahaviour is related to the uncontrolled out-diffusion of Se from the sample during sulfurization, resulting in a rapid incorporation of S. This ultimately resulted in the formation of an alloy containing mostly separate CuInSe$_2$ and CuInS$_2$ phases. In extreme cases of sufurization for periods of 60 minutes or longer, the sample was completely depleted of Se, resulting in the formation of a CuInS$_2$ alloy. SEM studies (FIG. 20) revealed the expected non-uniform structural nature of a heterogeneous alloy. Typically these films consisted of large, smooth-faced crystallites embedded in fine-grained material.

FIG. 21 is a SEM micrograph of a CuIn(Se$_{0.7}$S$_{0.3}$)$_2$ alloy (sample 200259-c). The alloy film is characterized by dense and relatively uniform structures with typical grain sizes around 1 µm. FIG. 22 depicts the (112) reflection of sample 200259-c. For the purpose of comparison, the theoretical expected 2θ positions of the (112) reflections of single-phase CuInSe$_2$ and CuInS$_2$ are indicated by the dotted lines in FIG. 22. It is important to note that the (112) reflection of the CuIn(Se,S)$_2$ film increased from about 26.63° for pure CuInSe$_2$ to 27.1° after S incorporation. This phenomenon is directly related to a decrease in the d-spacing of the alloy due to the homogeneous replacement of Se with S species. The diffraction peak also displays a high degree of symmetry with no evidence of compositional broadening or peak splitting as in the case of FIG. 19.

FIG. 23 is a concentration profile for sample 200258-b and is indicative of the fact that the sample alloy is substantially homogeneous in that the concentration of the elements of Cu, in. Se and S is substantially constant through the depth of the alloy until the Mo layer.

FIG. 24 is a GIXRD pattern for sample 200263-b which indicates that the sample is substantially homogeneous, having an absolute 2θ shift of 4.6% for a glancing angle of between 0.5° to 10°.

The above are only embodiments of the invention and it will be appreciated that many variations in detail are possible without thereby departing from the scope and spirit of the invention as claimed.

The invention claimed is:

1. A quaternary or higher group IB-IIIA-VIA alloy having the general formula (I):

$$A(B_{1-x}C_x)(D_{1-y}E_y)_2 \qquad (I)$$

wherein:
A is Cu;
B is In;
C is Ga;
D is a first group VIA element (hereinafter referred to as VIA$_1$);
E is a second group VIA element (hereinafter referred to as VIA$_2$); and
each of x and y independently are from 0 to 1, provided that both x and y are not zero or one at the same time and if x is zero y must be smaller than 1 and if y is zero x must be smaller than one;
and the alloy being characterized by an x-ray diffraction pattern (XRD) having a main [112] peak at a 2θ angle (2θ$_{(112)}$) of from 26° to 28° for Cu radiation at 40 kV, wherein a glancing incidence x ray diffraction pattern (GIXRD) for glancing angles at 0.5°, 1°, 2°, 5°, and 10° reflects an absolute shift in the 2θ$_{(112)}$ angle of less than 0.06° between any one of such glancing angles and all of the other of such angles considered one at a time.

2. The alloy of claim 1, wherein the alloy has a crystal structure comprising a lattice of unit cells, wherein all crystallographic planes of the unit cells show a variance in d-spacing of less than 0.01 Å.

3. The alloy of claim 1, wherein the element concentration of elements A, B, C, D and E, as characterised by XPS depth profiling, is substantially uniform through the alloy.

4. The alloy of claim 1, wherein D is Se and E is S, the alloy having a formula (II):

$$Cu(In_{1-x}Ga_x)(Se_{1-y}S_y)_2 \quad (II),$$

with x and y both being larger than 0 but smaller than 1.

5. The alloy of claim 4, wherein x is from 0.25 to 0.3 and y is from 0.05 to 0.8.

6. The alloy of claim 4, wherein the x-ray diffraction pattern (XRD) has a main [112] peak at a 2θ angle ($2\theta_{(112)}$) of from 26.9° to 28° for Cu radiation at 40 kV, taken at a d-spacing of from 3.3117 Å to 3.1840 Å.

7. The alloy of claim 4, wherein the absolute shift in the $2\theta_{(112)}$ angle is less than 0.01°.

8. The alloy of claim 4, wherein the alloy has a crystal structure comprising a lattice of unit cells, wherein all crystallographic planes of the unit cells show a variance in d-spacing of less than 0.001 Å.

9. The alloy of claim 6, wherein the main [112] peak is from a 2θ angle of from 27.0° to 27.5°.

10. The alloy of claim 6, wherein the main [112] peak is substantially symmetrical.

11. The alloy of claim 4, wherein the alloy has a band gap that can be shifted from 1 eV to 2.4 eV.

12. The alloy of claim 11, wherein the alloy has a band gap that can be shifted from 1.1 eV to 1.5 eV.

13. The alloy of claim 4, wherein the S content, as expressed by the molar ratio of S/(S+Se), is from 0.05 to 0.7.

14. The alloy of claim 1, wherein, D is Se and y =0, the alloy having the general formula (III):

$$Cu(In_{1-x}Ga_x)Se_2 \quad (III)$$

and x is larger than 0 but smaller than 1.

15. The alloy of claim 14, wherein x is from 0.25 and 0.3.

16. The alloy of claim 14, wherein the alloy has a crystal structure comprising a lattice of unit cells, wherein all crystallographic planes of the unit cells show a variance in d-spacing of less than 0.006 Å.

17. The alloy of claim 14, wherein the x-ray diffraction pattern (XRD) has a main [112] peak at a 2θ angle ($2\theta_{(112)}$) of from 26.80° to 27.0° for Cu radiation at 40 kV, taken at a d-spacing of from 3.3236 Å to 3.2990 Å.

18. The alloy of claim 14, wherein the GIXRD reflects an absolute shift in the $2\theta_{(112)}$ angle of less than 0.05° between any one of such glancing angles and all of the other of such angles considered one at a time.

19. The alloy of claim 17, wherein the main (112) peak lies from a 2θ angle of from 26.85° to 26.9°.

20. The alloy of claim 17, wherein the main (112) peak is substantially symmetrical.

21. The alloy of claim 14, wherein the alloy has a band gap which can be shifted from 1.1 eV to 1.2 eV.

22. The alloy of claim 21, wherein the alloy has a band gap which can be shifted from 1.15 eV to 1.18 eV.

23. The alloy of claim 14, wherein the Ga content, as expressed by the molar ratio of Ga/(Ga+In) is from 0.25 to 0.3.

24. The alloy of claim 1, wherein A is Cu, B is In, D is Se, E is S and x=0 and has the general formula (IV):

$$CuIn(Se_{1-y}S_y)_2 \quad (IV)$$

and y is larger than 0 but smaller than 1.

25. The alloy of claim 24, wherein y is from 0.1 and 0.5.

26. The alloy of claim 24, wherein the alloy has a crystal structure comprising a lattice of unit cells, wherein all crystallographic planes of the unit cells show a variance in d-spacing of less than 0.007 Å.

27. The alloy of claim 24, wherein the x-ray diffraction pattern (XRD) has a main (112) peak at a 2θ angle ($2\theta_{(112)}$) of from 26.80° to 27.3° for Cu radiation at 40 kV, taken at a d-spacing of from 3.3236 Å to 3.2640 Å.

28. The alloy of claim 24, wherein the GIXRD for a glancing angle of from 0.2° to 10° reflects an absolute shift in the $2\theta_{(112)}$ angle of less than 0.06°.

29. The alloy of claim 27, wherein the main (112) peak lies from a 2θ angle of from 27.0° to 27.2°.

30. The alloy of claim 24, wherein the alloy has a band gap which can be shifted from 1.05 eV to 1.23 eV.

31. The alloy of claim 30, wherein the alloy has a band gap which can be shifted from 1.15 eV to 1.20 eV.

32. The alloy of claim 24, wherein the S content, as expressed by the ratio of S/(S+Se) lies from 0.1 and 0.5.

33. A semiconductor film comprising a film of an alloy of claim 1.

34. The semiconductor film of claim 33, wherein said film is deposited onto a substrate which serves as a support for the alloy.

35. The semiconductor film according to claim 33, wherein the alloy is in the form of a film having a thickness of 1.5 to 2.0 μm.

36. A photovoltaic cell including a semiconductor film of an alloy of claim 1.

37. The photovoltaic cell according to claim 36, wherein the photovoltaic cell has a conversion efficiency of from 8 to 15%.

38. A pentenary alloy having the general formula:

$$Cu(In_{1-x}Ga_x)(Se_{1-y}S_y)_2$$

wherein x is between 0 and 1 and y is between 0 and 1;
the alloy being characterized by an x-ray diffraction pattern (XRD) having a main [112] peak at a 2θ angle ($2\theta_{(112)}$) of from 26° to 28° for Cu radiation at 40 kV, wherein a glancing incidence x ray diffraction pattern (GIXRD) for glancing angles at 0.5°, 1°, 2°, 5°, and 10° reflects an absolute shift in the $2\theta_{(112)}$ angle of less than 0.01° between any one of such glancing angles and all of the other of such angles considered one at a time.

39. The pentenary alloy of claim 38, wherein x is from 0.25 to 0.3 and y is from 0.05 to 0.5.

* * * * *

UNITED STATES PATENT AND TRADEMARK OFFICE
CERTIFICATE OF CORRECTION

| | |
|---|---|
| PATENT NO. | : 7,744,705 B2 |
| APPLICATION NO. | : 10/568229 |
| DATED | : June 29, 2010 |
| INVENTOR(S) | : Vivian Alberts |

It is certified that error appears in the above-identified patent and that said Letters Patent is hereby corrected as shown below:

On Page 1, (item 57 Abstract), Line 2, please change "IB-IIIA. VIA" to --IB-IIIA-VIA--

On Page 1, (item 57 Abstract), Line 3, after "invention" please change "relations" to --relates--

On Page 2, Column 2, Line 3, please change "CuInSe$_2$" to --CuInSe$_2$--

On Page 2, Column 2, Line 22, please change "CuInSe$_2$-" to --CuInSe$_2$- --

On Page 2, Column 2, Line 36, please change "a&" to --&--

In Column 1, Line 15, after "films" insert --.--

In Column 2, Line 25, please change "Cu(In$_{1-x}$Ga$_x$)(Se$_{1-y}$S$_y$)2" to --Cu(In$_{1-x}$Ga$_x$)(Se$_{1-y}$S$_y$)$_2$--

In Column 3, Line 32, please change "Cu(In,Ga)(Se$_2$" to --Cu(In,Ga)Se$_2$--

In Column 3, Line 38 (approximate), please change "In" to --in--

In Column 4, Lines 12-13, please change "0.40 and 50" to --0.4° and 5°--

In Column 4, Line 42 (approximate), please change "A$_{(B1-x}$C$_x$)(D$_{1-y}$E$_y$)$_2$" to --A(B$_{1-x}$C$_x$)(D$_{1-y}$E$_y$)$_2$--

In Column 4, Line 57, please change "(2θ$_{[112]}$)" to --(2θ$_{[112]}$)--

In Column 5, Lines 20-21, please change "(2θ[112])" to --(2θ$_{[112]}$)--

In Column 5, Line 22, after "3.1840" insert --.--

In Column 6, Line 22, please change "0.007" to --0.007.--

Signed and Sealed this
Twenty-eighth Day of December, 2010

David J. Kappos
*Director of the United States Patent and Trademark Office*

CERTIFICATE OF CORRECTION (continued)

U.S. Pat. No. 7,744,705 B2

In Column 9, Line 21, please change "ln(Se,S)" to --In(Se,S)--

In Column 9, Line 62, please change "Cu(In,Ga)Seth 2" to --Cu(In,Ga)Se$_2$--

In Column 12, Line 36, please change "FIG." to --FIGS.--

In Column 12, Line 36, please change "quanternary" to --quaternary--

In Column 12, Line 42, please change "FIG." to --FIGS.--

In Column 12, Line 43, please change "quanternary" to --quaternary--

In Column 13, Line 7, please change "(0.154056 A)" to --(0.154056 Å)--

In Column 13, Line 57, please change "1200° C." to --120° C.--

In Column 14, Line 28 (approximate), before "atomic" please change "(Ga+in)" to --(Ga+In)--

In Column 15, Line 21 (approximate), please change "FIG." to --FIGS.--

In Column 16, Line 42, please change "CuGa(Se$_{1-y}$s$y)_2$" to --CuGa(Se$_{1-y}$S$_y)_2$--

In Column 17, Line 1, please change "and(iv)" to --and (iv)--

In Column 17, Line 5, please change "and(iv)," to --and (iv),--

In Column 17, Line 16 (approximate), please change "Se$_{1-y}$S$_y)_2$" to --(Se$_{1-y}$S$_y)_2$--

In Column 17, Line 19 (approximate), please change "and(iv)" to --and (iv)--

In Column 17, Line 33 (Table 2), below "conditions" please change "H$_2$Se/Ar" to --H$_2$S/Ar--

In Column 19, Line 43 (approximate), after "0.001" insert --.--

In Column 22, Line 32, please change "and the their" to --and their--

In Column 23, Line 65, please change "and(iv)" to --and (iv)--

In Column 26, Line 32, please change "and the their" to --and their--

In Column 26, Line 58, please change "$^{554}$These" to --$^{\dagger}$These--

In Column 27, Line 57, please change "bahaviour" to --behaviour--

In Column 28, Line 35, please change "in. Se and S" to --In, Se and S--

CERTIFICATE OF CORRECTION (continued)
U.S. Pat. No. 7,744,705 B2

In Column 29, Line 8, in Claim 3, please change "D and" to --D, and--

In Column 29, Line 37, in Claim 14, please change "wherein, D" to --wherein D--

In Column 29, Line 42 (approximate), in Claim 15, please change "0.25 and 0.3." to --0.25 to 0.3--

In Column 29, Line 55 (approximate), in Claim 19, please change "(112]" to --[112]--

In Column 29, Line 57 (approximate), in Claim 20, please change "(112]" to --[112]--

In Column 30, Line 11, in Claim 25, please change "0.1 and 0.5." to --0.1 to 0.5.--

In Column 30, Line 17, in Claim 27, please change "(112]" to --[112]--

In Column 30, Line 23, in Claim 29, please change "(112]" to --[112]--

In Column 30, Line 30, in Claim 32, please change "0.1 and 0.5" to --0.1 to 0.5.--